(12) United States Patent
Won et al.

(10) Patent No.: US 11,599,327 B2
(45) Date of Patent: Mar. 7, 2023

(54) DISPLAY DEVICE

(71) Applicant: Samsung Display Co., LTD., Yongin-si (KR)

(72) Inventors: Byeong Hee Won, Incheon (KR); Keun Kyu Song, Seongnam-si (KR); Yi Joon Ahn, Seoul (KR); Sung Chan Jo, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 331 days.

(21) Appl. No.: 16/852,518

(22) Filed: Apr. 19, 2020

(65) Prior Publication Data

US 2021/0011681 A1 Jan. 14, 2021

(30) Foreign Application Priority Data

Jul. 9, 2019 (KR) .................. 10-2019-0082509

(51) Int. Cl.
| | |
|---|---|
| *G06F 3/16* | (2006.01) |
| *H01L 27/32* | (2006.01) |
| *G06F 1/18* | (2006.01) |
| *G06F 1/16* | (2006.01) |
| *G10K 9/13* | (2006.01) |
| *H04R 1/20* | (2006.01) |

(52) U.S. Cl.
CPC ............. *G06F 3/16* (2013.01); *G06F 1/1605* (2013.01); *G06F 1/189* (2013.01); *G10K 9/13* (2013.01); *H01L 27/3225* (2013.01); *H04R 1/20* (2013.01); *H04R 2499/15* (2013.01)

(58) Field of Classification Search
CPC .......... G06F 3/16; G06F 1/1605; G06F 1/189; G10K 9/13; G10K 9/22; H01L 27/3225; H01L 27/3244; H04R 1/20; H04R 2499/15; H04R 1/028; H04R 7/10; H04R 9/025; H04R 9/046; H04R 9/063; H04R 9/02; H04R 9/06; H04R 7/045; H04R 1/06; H04R 9/043; G02F 1/133; G09G 3/30; H05K 5/03
See application file for complete search history.

(56) References Cited

U.S. PATENT DOCUMENTS

| | | | |
|---|---|---|---|
| 10,009,683 B2 | 6/2018 | Choi et al. | |
| 2015/0341714 A1* | 11/2015 | Ahn | H04R 7/045 |
| | | | 381/333 |

(Continued)

FOREIGN PATENT DOCUMENTS

| | | |
|---|---|---|
| KR | 10-1704517 | 2/2017 |
| KR | 20200110562 | 9/2020 |

*Primary Examiner* — Angelica M McKinney
(74) *Attorney, Agent, or Firm* — H.C. Park & Associates, PLC

(57) ABSTRACT

A display device including a display panel including a first substrate and a pixel array layer disposed on a first surface of the first substrate, a first sound generation device disposed on a second surface of the first substrate opposing the first surface, and configured to vibrate the display panel and output first sound, and a circuit board disposed on the second surface of the first substrate, in which the first sound generation device includes a bobbin fixed on one surface of the first substrate, a voice coil surrounding a side surface of the bobbin, a magnet disposed on the bobbin and spaced apart from the bobbin, and a plate disposed on the magnet and fixed to the circuit board.

23 Claims, 31 Drawing Sheets

(56) References Cited

U.S. PATENT DOCUMENTS

| | | | |
|---|---|---|---|
| 2019/0037164 A1* | 1/2019 | Kim | H04R 17/005 |
| 2019/0045287 A1* | 2/2019 | Lee | H04R 1/26 |
| 2020/0296496 A1 | 9/2020 | Im et al. | |
| 2021/0105550 A1* | 4/2021 | You | H04R 7/045 |

\* cited by examiner

DISPLAY DEVICE

CROSS-REFERENCE TO RELATED APPLICATION

This application claims priority from and the benefit of Korean Patent Application No. 10-2019-0082509, filed on Jul. 9, 2019, which is hereby incorporated by reference for all purposes as if fully set forth herein.

BACKGROUND

Field

Exemplary embodiments of the invention relate generally to a display device.

Discussion of the Background

With the advancement of the information age, demands for display devices for displaying images in various forms are increasing. For example, the display devices are being applied to various electronic devices, such as smartphones, tablet personal computers (PC), digital cameras, laptop computers, navigation devices, monitors, and televisions (TVs). The display device may be a flat display device, such as a liquid crystal display device, a field emission display device, an organic light-emitting display device, or a quantum dot light-emitting display device.

The display device may include a display panel configured to display an image and a speaker configured to output sound. The speaker may output sound in a direction towards a front surface of the display device. However, due to limited space of the display device, the speaker is disposed on a lower surface or one side of a display panel to output sound in a direction towards the lower surface or one side of the display device. As such, the quality of sound heard by a user may be lowered.

The above information disclosed in this Background section is only for understanding of the background of the inventive concepts, and, therefore, it may contain information that does not constitute prior art.

SUMMARY

Display devices constructed according to exemplary embodiments of the invention are capable of outputting sound in a direction towards a front surface of a display device by vibrating a display panel using a sound generation device, thereby improving sound quality.

Additional features of the inventive concepts will be set forth in the description which follows, and in part will be apparent from the description, or may be learned by practice of the inventive concepts.

A display device according to an exemplary embodiment comprises: a display panel including a first substrate and a pixel array layer disposed on a first surface of the first substrate; a first sound generation device disposed on a second surface opposite to the first surface of the first substrate and configured to vibrate the display panel and output first sound; and a circuit board disposed on the second surface of the first substrate. The first sound generation device includes a bobbin fixed on one surface of the first substrate, a voice coil surrounding a side surface of the bobbin, a magnet disposed on the bobbin and spaced apart from the bobbin, and a plate disposed on the magnet and fixed to the circuit board.

A display device according to an exemplary embodiment comprises: a display panel including a first substrate and a pixel array layer disposed on a first surface of the first substrate; a first sound generation device disposed on a second surface opposite to the first surface of the first substrate and configured to vibrate the display panel and output first sound; and a bottom cover disposed on the second surface of the first substrate. The first sound generation device includes a bobbin fixed on one surface of the first substrate, a voice coil surrounding a side surface of the bobbin, a magnet disposed on the bobbin and spaced apart from the bobbin, and a plate disposed on the magnet and fixed to the bottom cover.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
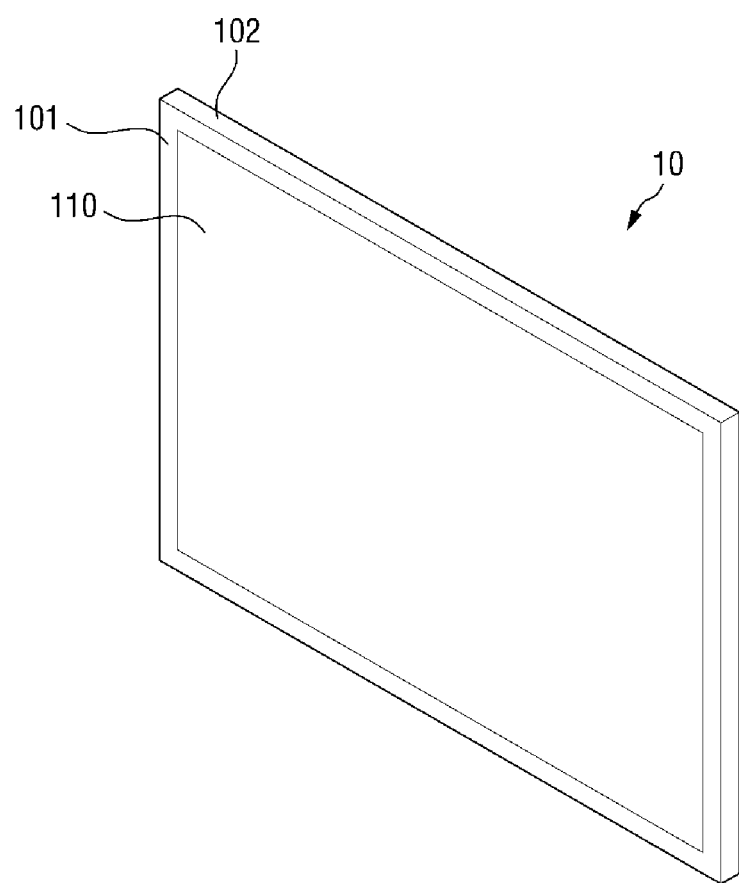
FIG. 1 is a perspective view of a display device according to an exemplary embodiment.
Figure 1:
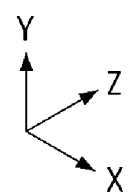

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, a display device 10 according to exemplary embodiments will be described with reference to an organic light-emitting display device, which uses an organic light-emitting element as a light-emitting element. However, the inventive concepts are not limited thereto. For example, in some exemplary embodiments, the display device may be an inorganic light-emitting display device using a micro light-emitting diode or an inorganic semiconductor (inorganic light-emitting diode) as a light-emitting element.

Figure 2:
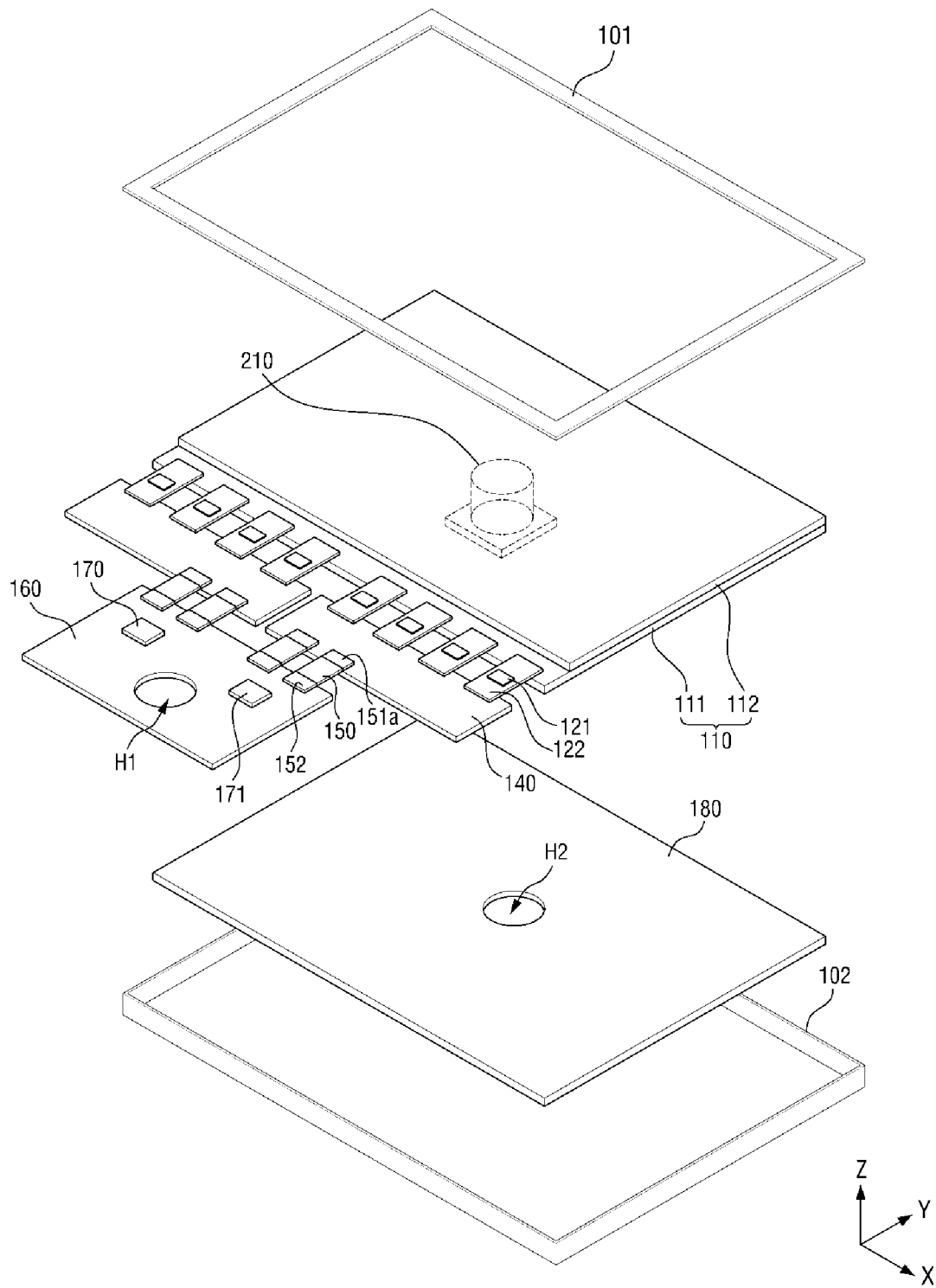
FIG. 2 is an exploded perspective view of a display device according to an exemplary embodiment.

FIG. 1 is a perspective view of a display device according to an exemplary embodiment. FIG. 2 is an exploded perspective view of a display device according to an exemplary embodiment.

Referring to FIGS. 1 and 2, the display device 10 according to the illustrated exemplary embodiment includes an upper set cover 101, a lower set cover 102, a display panel 110, source driving circuits 121, flexible films 122, a heat dissipation film 130, source circuit boards 140, first cables 150, a control circuit board 160, a timing control circuit 170, a bottom cover 180, and a first sound generation device 210.

As used herein, the terms "upper portion," "top," and "upper surface" may refer to a direction, in which a second substrate 112 is disposed with respect to a first substrate 111 of the display panel 110, e.g., a Z-axis direction, and the terms "lower portion," "bottom," and "lower surface" may refer to a direction, in which the heat dissipation film 130 is disposed with respect to the first substrate 111 of the display panel 110, e.g., a direction opposite to the Z-axis. In addition, the terms "left," "right," "upper," and "lower" may refer to a direction when the display panel 110 is viewed from above. For example, the term "left" may refer to an X-axis direction, the term "right" may refer to a direction opposite to the X-axis direction, the term "upper" may refer to a Y-axis direction, and the term "lower" may refer to a direction opposite to the Y-axis direction.

The upper set cover 101 and the lower set cover 102 may be disposed to surround an edge of the display panel 110. The upper set cover 101 and the lower set cover 102 may cover a non-display region surrounding a display region of the display panel 110. More particularly, the upper set cover 101 may be disposed to cover an edge of an upper surface of the display panel 110, and the lower set cover 102 may be disposed to cover side surfaces of the display panel 110 and a lower surface of the bottom cover 180. The upper set cover 101 and the lower set cover 102 may be coupled to each other using a fixing member, such as a screw or an adhesive member, such as double-sided tape or an adhesive. The upper set cover 101 and the lower set cover 102 may be made of plastic or metal, or may include both plastic and metal.

The display panel 110 may have substantially a rectangular shape in a plan view. For example, as shown in FIG. 2, a top view of the display panel 110 may substantially have a rectangular shape, which has a long side in a first direction (X-axis direction) and a short side in a second direction (Y-axis direction). A corner at which the long side in the first direction (X-axis direction) meets the short side in the second direction (Y-axis direction) may be formed as a right angle or be rounded to have a certain curvature. The shape of the top view of the display device 10 is not limited to the rectangular shape, but may be formed in another polygonal, circular, or elliptical shape.

The display panel 110 is illustrated in FIG. 2 as being formed to be flat, but the inventive concepts are not limited thereto. For example, in some exemplary embodiments, the display panel 110 may be formed to be bent at a certain curvature.

The display panel 110 may include the first substrate 111 and the second substrate 112. The second substrate 112 may be disposed to face a first surface of the first substrate 111. The first substrate 111 and the second substrate 112 may be formed to be rigid or flexible. The first substrate 111 may be made of glass or plastic. The second substrate 112 may be made of glass, plastic, an encapsulation film, or a barrier film. The plastic may be one selected from polyethersulphone (PES), polyacrylate (PA), polyarylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose triacetate (CAT), cellulose acetate propionate (CAP), and combinations thereof. The encapsulation film or the barrier film may be a film, in which a plurality of inorganic films are stacked.

Figure 4:
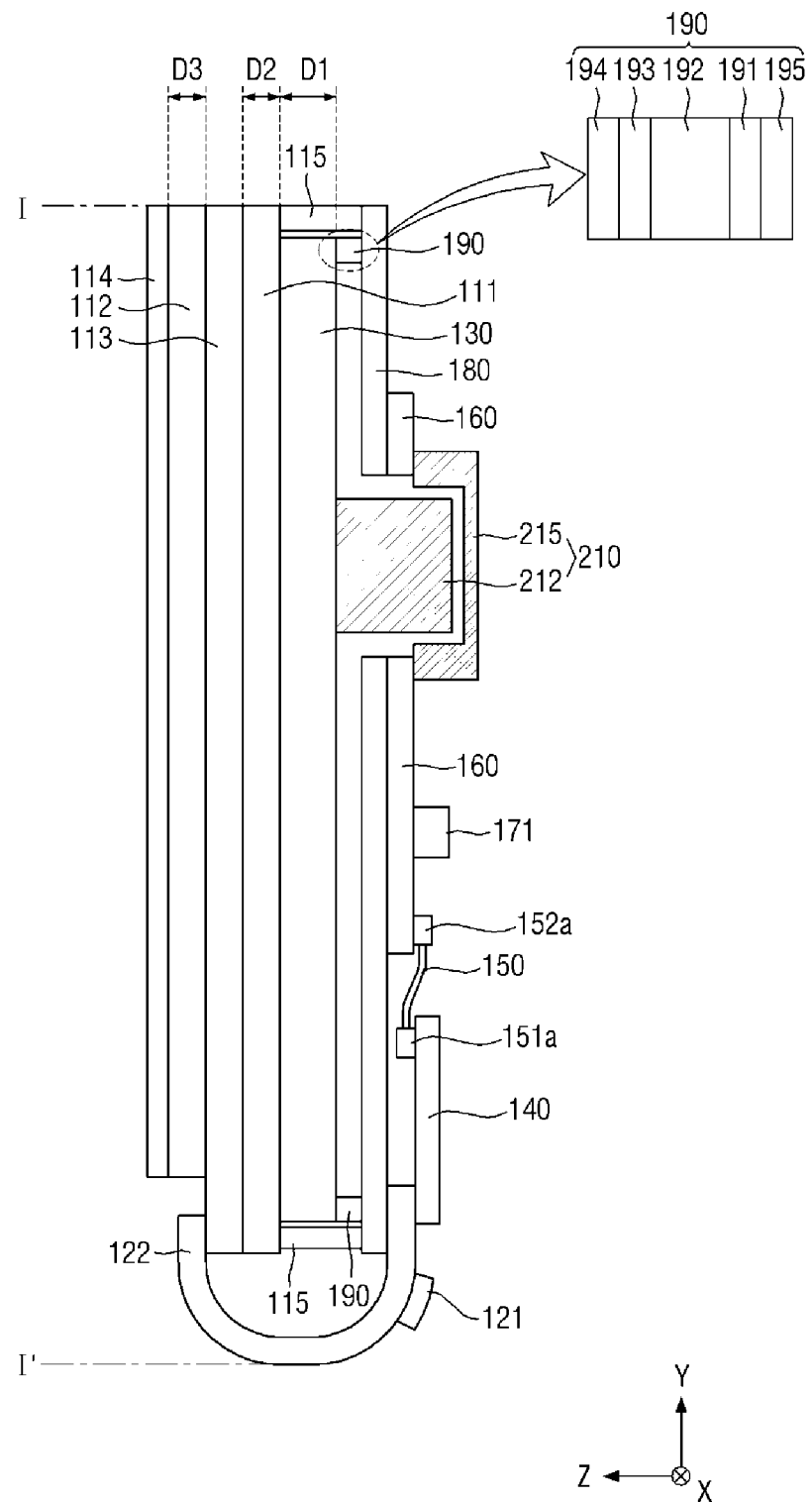
FIG. 4 is a cross-sectional view taken along line I-I' of FIG. 3 according to an exemplary embodiment.

The display panel 110 may further include a pixel array layer 113 and polarizing film 114 (see FIG. 4). The pixel array layer 113 may be disposed between the first substrate 111 and the second substrate 112. The polarizing film 114 may be disposed on the second substrate 112. The pixel array layer 113 may include a thin film transistor layer TFTL, a light-emitting element layer EML (see FIG. 5).

Figure 5:
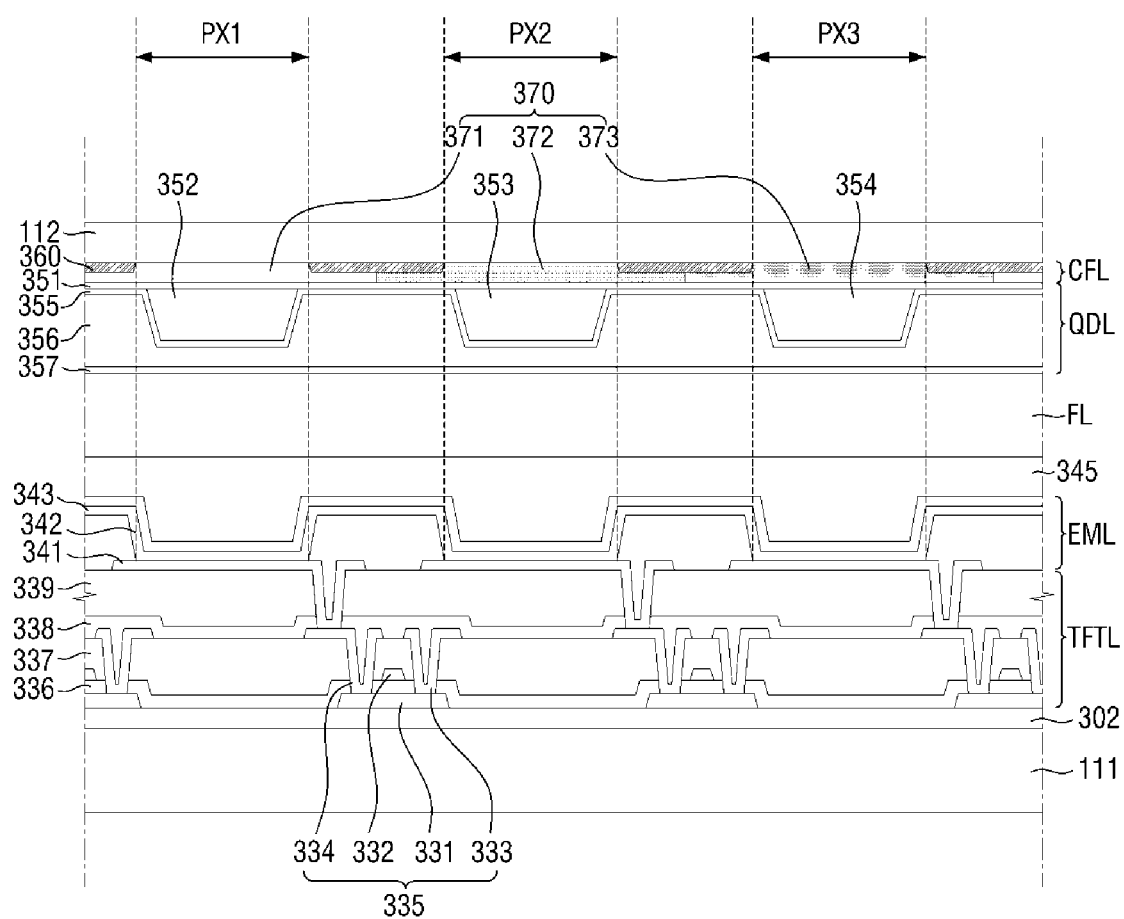
FIG. 5 is a cross-sectional view of a display region of the display panel of FIG. 4 according to an exemplary embodiment.

As shown in FIG. 5, the display panel 110 may include a thin film transistor layer TFTL, a light-emitting element layer EML, a filler FL, a light conversion layer QDL, and a color filter layer CFL, which are disposed between the first substrate 111 and the second substrate 112. In this case, the first substrate 111 is a thin film transistor substrate, in which the thin film transistor layer TFTL, the light-emitting element layer EML, and a thin film encapsulation layer TFEL are formed, and the second substrate 112 is a color filter layer substrate, in which the light conversion layer QDL and the color filter layer CFL are formed. The filler FL may be disposed between the thin film encapsulation layer TFEL of the first substrate 111 and the light conversion layer QDL of the second substrate 112. The thin film transistor layer TFTL, the light-emitting element layer EML, the filler FL, the light conversion layer QDL, and the color filter layer CFL of the display panel 110 will be described in more detail below with reference to FIG. 5.

Alternatively, the second substrate 112 of the display panel 110 may be omitted, and the thin film encapsulation layer may be disposed on the light-emitting element layer EML. In this case, the filler FL may be omitted, and the light conversion layer QDL and the color filter layer CFL may be disposed on the thin film encapsulation layer.

One side of each of the flexible films 122 may be disposed on the first surface of the first substrate 111 of the display panel 110, and the other side thereof may be attached on one surface of a source circuit board 140. More particularly, since a size of the first substrate 111 is greater than a size of the second substrate 112, one side of the first substrate 111 may not be covered by the second substrate 112 and may be exposed. The flexible films 122 may be attached to one side of the first substrate 111, which is not covered by the second substrate 112 and is exposed. Each of the flexible films 122 may be attached on the first surface of the first substrate 111 and one surface of the source circuit board 140 using an anisotropic conductive film, for example.

Figure 3:
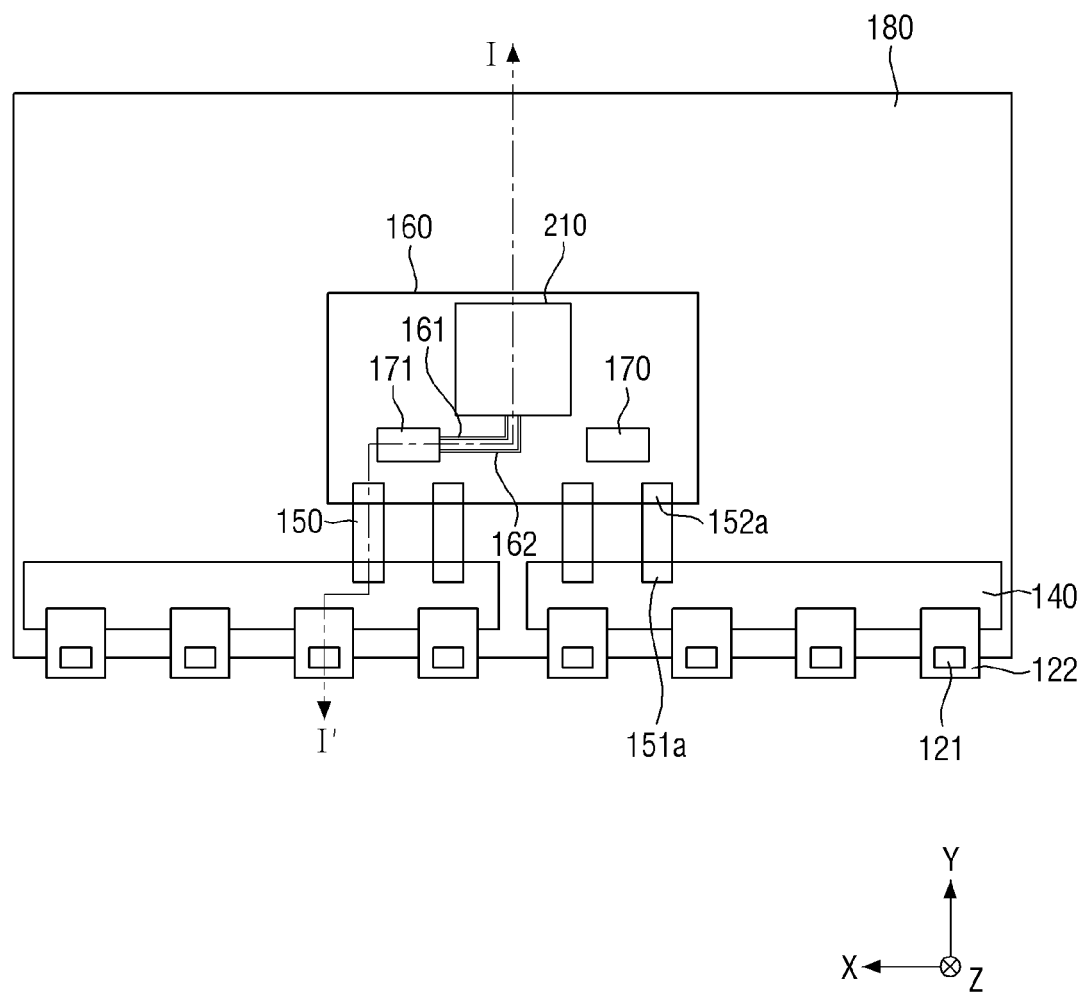
FIG. 3 is a bottom view of a display device according to an exemplary embodiment.

Each of the flexible films 122 may be a flexible film, such as a tape carrier package or a chip on film. Each of the flexible films 122 may be bent. As such, as shown in FIGS. 3 and 4, the flexible films 122 may be bent to a lower portion of the first substrate 111. In this case, the source circuit boards 140, the first cables 150, and the control circuit board 160 may be disposed on a lower surface of the heat dissipation film 130.

FIG. 2 illustrates that eight flexible films 122 are attached on the first substrate 111 of the display panel 110, however, the inventive concepts are not limited to a particular number of the flexible films 122 disposed on the first substrate 111.

A source driving circuit 121 may be disposed on one surface of each of the flexible films 122. Each of the source driving circuits 121 may be formed as an integrated circuit (IC). The source driving circuits 121 may convert digital video data into analog data voltages in response to a source control signal of the timing control circuit 170, and supply the analog data voltages to data lines of the display panel 110 through the flexible films 122.

The source circuit boards 140 may be connected to the control circuit board 160 through the first cables 150. The source circuit boards 140 may include first connectors 151 for connection to the first cables 150. The source circuit boards 140 may be a flexible printed circuit board or a printed circuit board. The first cables 150 may be flexible cables.

The control circuit board 160 may be connected to the source circuit boards 140 through the first cables 150. The control circuit board 160 may include second connectors 152 for connection to the first cables 150.

A first hole H1, in which the first sound generation device 210 is disposed, may be formed in a region of the control circuit board 160 to correspond to the first sound generation device 210. The control circuit board 160 may be fixed on one surface of the bottom cover 180 through a fixing member, such as a screw. The control circuit board 160 may be a flexible printed circuit board or a printed circuit board.

FIG. 2 illustrates that four first cables 150 connect the source circuit boards 140 and the control circuit board 160, however, the inventive concepts are not limited to a particular number of the first cables 150. In addition, FIG. 2 illustrates two source circuit boards 140, however, the inventive concepts are not limited to a particular number of the source circuit boards 140.

In some exemplary embodiments, when the number of the flexible films 122 is small, the source circuit boards 140 may be omitted. In this case, the flexible films 122 may be connected directly to the control circuit board 160.

The timing control circuit 170 may be disposed on one surface of the control circuit board 160. The timing control circuit 170 may be formed as an IC. The timing control circuit 170 may receive digital video data and timing signals from a system-on-chip of a system circuit board, and may generate source control signals for controlling a timing of the source driving circuits 121 in response to the timing signals.

A sound driving circuit 171 may be disposed on one surface of the control circuit board 160. The sound driving circuit 171 may be formed as an IC. The sound driving circuit 171 may receive sound data from the system circuit board. The sound driving circuit 171 may convert the sound data, which may be digital data, into a first sound signal, which may be an analog signal, and may output the first sound signal to the first sound generation device 210.

The system-on-chip may be mounted on the system circuit board, which is connected to the control circuit board 160 through a flexible cable, and may be formed as an IC. The system-on-chip may be a processor of a smart television (TV), a central processing unit (CPU) or a graphic card of a computer or a laptop computer, or an application processor of a smartphone or a tablet personnel computer (PC). The system circuit board may be a flexible printed circuit board or a printed circuit board.

A power supply circuit may be additionally attached on one surface of the control circuit board 160. The power supply circuit may generate voltages required for driving the display panel 110 from main power applied from the system circuit board, and may supply the voltages to the display panel 110. For example, the power supply circuit may generate a high potential voltage, a low potential voltage, and an initialization voltage for driving an organic light-emitting element, and may supply the generated high potential voltage, low potential voltage, and initialization voltage to the display panel 110. In addition, the power supply circuit may generate and supply driving voltages for driving the source driving circuits 121, the timing control circuit 170, and the like. The power supply circuit may be formed as an IC. Alternatively, the power supply circuit may also be disposed on a power circuit board formed separately from the control circuit board 160. The power circuit board may be a flexible printed circuit board or a printed circuit board.

The first sound generation device 210 may be disposed on a second surface opposite to the first surface of the first substrate 111. The first sound generation device 210 may be a vibration device capable of vibrating the display panel 110 in a third direction (Z-axis direction) in response to the first sound signal of the sound driving circuit 171. In this case, the display panel 110 may function as a diaphragm for outputting sound. The first sound generation device 210 may be an exciter, which vibrates the display panel 110 by generating a magnetic force using a voice coil.

The bottom cover 180 may be disposed on the second surface of the first substrate 111. A second hole H2, in which the first sound generation device 120 is disposed, may be formed in a region of the bottom cover 180 to correspond to the first sound generation device 210. The bottom cover 180 may be made of metal or tempered glass.

As described above, according to the display device 10 shown in FIGS. 1 and 2, the first sound generation device 210 outputs sound using the display panel 110 as a diaphragm, and thus, the sound may be output in a direction towards a front surface of the display device 10. Accordingly, sound quality may be improved. In addition, due to the first sound generation device 210, a separate speaker conventionally disposed on a lower surface or one side of the display panel 110 may be omitted.

The display device 10 shown in FIGS. 1 and 2 is illustrated as a medium large-sized display device including a plurality of source driving circuits 121, however, the inventive concepts are not limited thereto. For example, in some exemplary embodiments, the display device 10 may be a small-sized display device including one source driving circuit 121. In this case, the flexible films 122, the source circuit boards 140, and the cables 150 may be omitted. The source driver circuit 121 and the timing control circuit 170 may be integrated into one IC, and may be attached on one flexible circuit board or attached on the first substrate 111 of the display panel 110. The medium large-sized display device may include monitors and televisions, and the small-sized display device may include smartphones and tablet PCs, without being limited thereto.

FIG. 3 is a bottom view of a display device according to an exemplary embodiment. FIG. 4 is a cross-sectional view taken along line I-I' of FIG. 3.

Referring to FIGS. 3 and 4, the heat dissipation film 130 may be disposed on the second surface of the first substrate 111. The first sound generation device 210 may be disposed on one surface of the heat dissipation film 130. The heat dissipation film 130 may dissipate heat generated in the first sound generation device 210. The heat dissipation film 130 may include a metal layer including of silver (Ag), copper (Cu), or aluminum (Al), or graphite, which has high thermal conductivity.

In addition, the heat dissipation film 130 may include a plurality of graphite layers or a plurality of metal layers formed in the first direction (X-axis direction) and the second direction (Y-axis direction), rather than in the third direction (Z-axis direction). In this case, the heat generated in the first sound generation device 210 may be diffused in the first direction (X-axis direction) and the second direction (Y-axis direction), and thus, may dissipate heat more effectively. As such, effects from the heat generated in the first sound generation device 210 to the display panel 110 may be minimized due to the heat dissipation film 130. As such, in order to prevent the effects of the heat generated in the first sound generation device 210 to the display panel 110, a thickness D1 of the heat dissipation film 130 may be greater than a thickness D2 of the first substrate 111 and a thickness D3 of the second substrate 112. As used herein, the first direction (X-axis direction) may be a width direction of the display panel 110, the second direction (Y-axis direction) may be a height direction of the display panel 110, and the third direction (Z-axis direction) may be a thickness direction of the display panel 110.

A size of the heat dissipation film 130 may be less than a size of the first substrate 111, and thus, an edge of one surface of the first substrate 111 may not be covered by the heat dissipation film 130 and may be exposed.

In some exemplary embodiments, the heat dissipation film 130 may be omitted. In this case, components disposed on one surface of the heat dissipation film 130 may be disposed on one surface of the first substrate 111.

The flexible films 122 may be bent to a lower portion of the bottom cover 180, and may be attached to the source circuit board 140 on one surface of the bottom cover 180. The source circuit board 140 and the control circuit board 160 are disposed on the one surface of the bottom cover 180, and may be connected to each other through the first cables 150.

The first sound generation device 210 may be disposed near to a center of the display panel 110. As shown in FIGS. 6 to 9, the first sound generation device 210 may include a magnet 211, a bobbin 212, a voice coil 213, and a plate 215.

In FIG. 4, only the bobbin 212 and the plate 215 of the first sound generation device 210 are illustrated. The bobbin 212 may be attached on one surface of the heat dissipation film 130 using an adhesive member. The adhesive member may be a double-sided adhesive or double-sided tape, for example. The bobbin 212 may be formed to have substantially a cylindrical shape. The magnets 211 may be disposed to inner and outer sides of the bobbin 212. The plate 215 may be fixed to the control circuit board 160 through a fixing member, such as a screw.

The magnet 211 and the bobbin 212 are disposed in the first hole H1 of the control circuit board 160 and the second hole H2 of the bottom cover 180. However, since the plate 215 is disposed on one surface of the control circuit board 160, the plate 215 is not disposed in the first hole H1 of the control circuit board 160 and the second hole H2 of the bottom cover 180. A size of the first hole H1 may be less than a size of the plate 215. The size of the first hole H1 may be less than a size of the second hole H2.

Figure 11A:
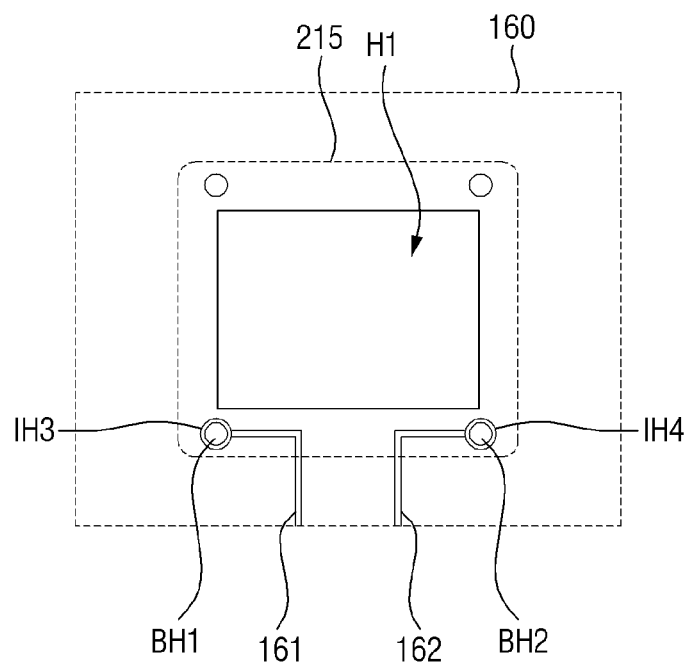
FIG. 11A is an enlarged plan view of a first hole and board holes of a control circuit board.

FIGS. 3 and 4 illustrate that the magnet 211 and the bobbin 212 have substantially a circular shape in a plan view, the plate 215 has substantially a quadrangular shape in a plan view, and the first hole H1 and the second hole H2 have substantially a circular shape in a plan view. However, the inventive concepts are not limited to one planar shape of the magnet 211, the bobbin 212, the plate 215, the first hole H1, and the second hole H2. For example, in some exemplary embodiments, the planar shape of at least one of the magnet 211, the bobbin 212, the first hole H1, and the second hole H2 may be substantially an elliptical shape or a polygonal shape. More particularly, the shape of the plan view of the first hole H1 is illustrated in FIG. 11A as being substantially a quadrangular shape. In addition, the shape of the plan view of the plate 215 may be substantially a circular shape, an elliptical shape, or a polygonal shape.

Figure 29:
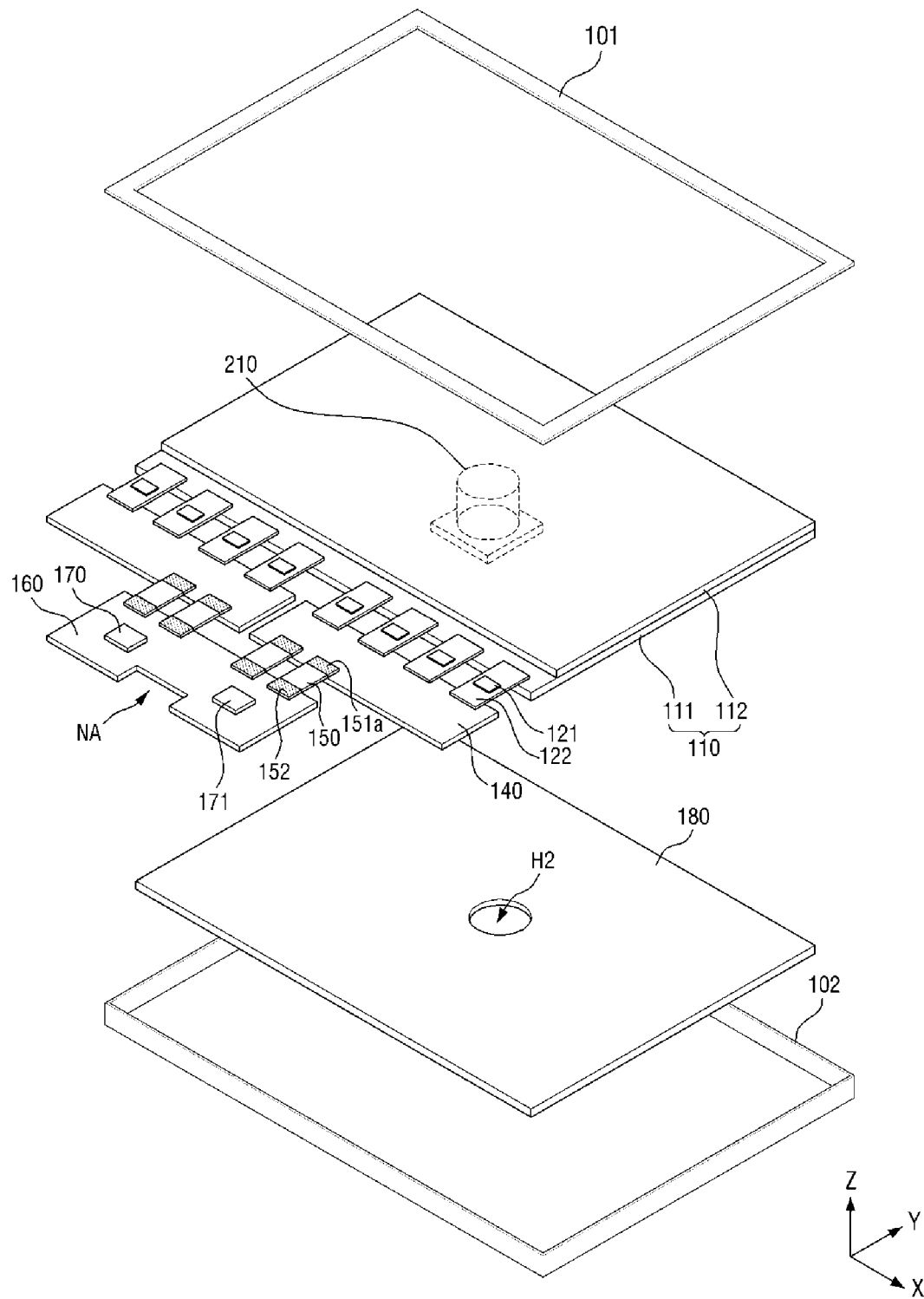
FIG. 29 is an exploded perspective view of a display device according to an exemplary embodiment.
Figure 30:
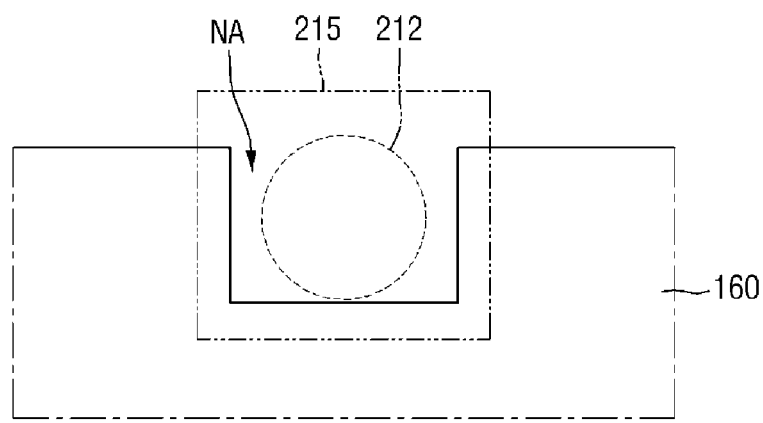
FIG. 30 is a plan view of a control circuit board of FIG. 29.

In addition, as shown in FIGS. 29 and 30, the control circuit board 160 may include a notch NA formed in one side of the control circuit board 160, rather than the first hole H1. More particularly, a portion of the control circuit board 160 may be removed from one side of the control circuit board 160. The notch NA may have a shape bent in a polygonal shape, such as a quadrangular shape, a shape bent in a circular shape, or a shape bent in an elliptical shape in a plan view. A portion of the bobbin 212 may be disposed in the notch NA, and the plate 215 may be disposed to cover the notch NA. A length of the notch NA in the first direction (X-axis direction) may be less than a length of the plate 215 in the first direction (X-axis direction). A length of the notch NA in the second direction (Y-axis direction) may be less than a length of the plate 215 in the second direction (Y-axis direction).

The timing control circuit 170 and the sound driving circuit 171 may be disposed on the control circuit board 160. In some exemplary embodiments, the sound driving circuit 171 may be disposed on another circuit board other than the control circuit board 160. For example, the sound driving circuit 171 may be disposed on the system circuit board, the power circuit board, or a sound circuit board. The sound circuit board may refer to a circuit board, on which is only the sound driving circuit 171 is disposed without other ICs.

The sound driving circuit 171 may generate the first sound signals including a first driving voltage and a second driving voltage for driving the first sound generation device 210 according to sound data, which may be digital data. The sound driving circuit 171 may apply the first driving voltage to a first sound wiring 161 of the control circuit board 160, and may apply the second driving voltage to a second sound wiring 162 of the control circuit board 160.

The sound driving circuit 171 may include a digital signal processor (DSP) configured to digitize the first sound signals, a digital-to-analog converter (DAC) configured to convert digital signals processed by the DSP into driving voltages, which may be analog signals, and an amplifier (AMP) configured to amplify and output the analog driving voltages converted by the DAC.

As a distance between the sound driving circuit 171 and the first sound generation device 210 is decreased, the first sound signal is less likely to be affected by noise. As such, sound quality of the first sound output by the first sound generation device 210 may be increased. To this end, the distance between the first sound generation device 210 and the sound driving circuit 171 according to an exemplary embodiment may be less than a distance between the first sound generation device 210 and the timing control circuit 170.

The first sound generation device 210 may receive the first sound signals including the first driving voltage and the second driving voltage from the sound driving circuit 171. The first sound generation device 210 may vibrate the display panel 110 to output sound according to the first driving voltage and the second driving voltage. When the plate 215 of the first sound generation device 210 is disposed on the control circuit board 160, one end of the voice coil 213 of the first sound generation device 210 may be electrically connected to the first sound wiring 161 of the control circuit board 160, and the other end of the voice coil 213 may be electrically connected to the second sound wiring 162 of the control circuit board 160.

As shown in FIG. 4, the size of the heat dissipation film 130 may be less than the size of the first substrate 111, and thus, four side edges of one surface of the first substrate 111 may not covered by the heat dissipation film 130 and be exposed. A first adhesive member 115 may be disposed at the four side edges of one surface of the first substrate 111, which are not covered by the heat dissipation film 130 and are exposed. As shown in FIG. 4, the first adhesive member 115 may attach one surface of the first substrate 111 and the other surface of the bottom cover 180. The first adhesive member 115 may be double-sided tape including a buffer film, such as foam.

A blocking member 190 may be disposed at four side edges of the heat dissipation film 130. The blocking member 190 may block propagation of vibration of the display panel 110 generated by the first sound generation device 210 or transmission of sound generated by the vibration of the display panel 110. The blocking member 190 may be attached to one surface of the heat dissipation film 130 and the other surface of the bottom cover 180. Alternatively, when the heat dissipation film 130 is omitted, the blocking member 190 may be attached to one surface of the first substrate 111 and the other surface of the bottom cover 180.

As shown in FIG. 4, the blocking member 190 may include a base film 191, a buffer film 192, a sacrificial layer 193, a first adhesive layer 194, and a second adhesive layer 195.

The base film 191 may be made of plastic. For example, the base film 191 may include polyethylene terephthalate (PET), without being limited thereto.

The buffer film 192 may be disposed on one surface of the base film 191. The buffer film 192 may be made of foam having elasticity. For example, the buffer film 192 may include polyurethane, silicon, rubber, aerogel, or the like, without being limited thereto.

The sacrificial layer 193 may be disposed on one surface of the buffer film 192. The sacrificial layer 193 may function as a layer to be detached, when the blocking member 190 is erroneously attached and then is to be removed. In this case, portions of the first adhesive layer 194 and the sacrificial layer 193 may be retained on the other surface of the bottom cover 180. The sacrificial layer 193 may be made of a low elastic material. For example, the sacrificial layer 193 may include polyurethane, without being limited thereto. In some exemplary embodiments, the sacrificial layer 193 may be omitted.

The first adhesive layer 194 may be disposed on one surface of the sacrificial layer 193. The first adhesive layer 194 may be attached on the other surface of the bottom cover 180. The second adhesive layer 195 may be disposed on the other surface of the base film 191. The second adhesive layer 195 may be attached on one surface of the heat dissipation film 130. The first adhesive layer 194 and the second adhesive layer 195 may include acrylic adhesive or silicon adhesive, without being limited thereto.

FIG. 5 is a cross-sectional view of a display region of the display panel of FIG. 4 according to an exemplary embodiment.

Referring to FIG. 5, the display panel 110 may include the first substrate 111, the second substrate 112, the thin film transistor layer TFTL, the light-emitting element layer EML, the filler FL, the light conversion layer QDL, and the color filter layer CFL.

A buffer film 302 may be formed on one surface of the first substrate 111 facing the second substrate 112. The buffer film 302 may be formed on the first substrate 111 to protect thin film transistors 335 and light-emitting elements from moisture permeating through the first substrate 111, which may be vulnerable to moisture transmission. The buffer film 302 may include a plurality of alternately stacked inorganic films. For example, the buffer film 302 may be formed as a multi-film, in which one or more inorganic films of a silicon oxide ($SiO_x$) film, a silicon nitride ($SiN_x$) film, and SiON are alternately stacked. In some exemplary embodiments, the buffer film 302 may be omitted.

The thin film transistor layer TFTL may be formed on the buffer film 302. The thin film transistor layer TFTL includes thin film transistors 335, a gate insulating film 336, an interlayer insulating film 337, a protective film 338, and a planarizing film 339.

The thin film transistors 335 are formed on the buffer film 302. The thin film transistor 335 includes an active layer 331, a gate electrode 332, a source electrode 333, and a drain electrode 334. The thin film transistor 335 is illustrated in FIG. 5 as a top gate type, in which the gate electrode 332 is disposed on the active layer 331, however, the inventive concepts are not limited thereto. In some exemplary embodiments, the thin film transistor 335 may be formed as a bottom gate type, in which the gate electrode 332 is disposed below the active layer 331, or a double gate type, in which the gate electrode 332 is disposed on both of upper and lower portions of the active layer 331.

The active layer 331 is formed on the buffer film 302. The active layer 331 may be made of a silicon-based semiconductor material or an oxide-based semiconductor material. In some exemplary embodiments, a light blocking layer configured to block external light incident on the active layer 331 may be formed between the buffer film 302 and the active layer 331.

The gate insulating film 336 may be formed on the active layer 331. The gate insulating film 316 may be formed as an inorganic film, such as a silicon oxide ($SiO_x$) film, a silicon nitride (SiN) film, or a multi-film thereof.

The gate electrode 332 and a gate line may be formed on the gate insulating film 316. The gate electrode 332 and the gate line may be formed as a single layer or a multi-layer including at least one of molybdenum (Mo), aluminum (Al), chromium (Cr), gold (Au), titanium (Ti), nickel (Ni), neodymium (Nd), copper (Cu), or an alloy thereof.

The interlayer insulating film 337 may be formed on the gate electrode 332 and the gate line. The interlayer insulating film 337 may be formed as an inorganic film, such as a silicon oxide ($SiO_x$) film, a silicon nitride (SiN) film, or a multi-film thereof.

The source electrode 333, the drain electrode 334, and a data line may be formed on the interlayer insulating film 337. The source electrode 333 and the drain electrode 334 may be connected to the active layer 331 through contact holes passing through the gate insulating film 336 and the interlayer insulating film 337. The source electrode 333, the drain electrode 334, and the data line may be formed as a single layer or a multi-layer including at least one of molybdenum (Mo), aluminum (Al), chromium (Cr), gold (Au), titanium (Ti), nickel (Ni), neodymium (Nd), copper (Cu), or an alloy thereof.

The protective film 338 may be formed on the source electrode 333, the drain electrode 334, and the data line to insulate the thin film transistor 335. The protective film 338 may be formed as an inorganic film, such as a silicon oxide ($SiO_x$) film, a silicon nitride ($SiN_x$) film, or a multi-film thereof.

The planarizing film 339 may be formed on the protective film 338 to planarize a stepped portion due to the thin film transistor 335. The planarizing film 339 may be formed as an organic film including an acryl resin, an epoxy resin, a phenolic resin, a polyamide resin, a polyimide resin, or the like.

The light-emitting element layer EML may be formed on the thin film transistor layer TFTL. The light-emitting element layer EML includes light-emitting elements and a pixel definition film 344.

The light-emitting elements and the pixel definition film 344 are formed on the planarizing film 339. The light-emitting element according to the illustrated exemplary embodiment may be an organic light-emitting device. In this case, the light-emitting element may include an anode electrode 341, light-emitting layers 342, and a cathode electrode 343.

The anode electrode 341 may be formed on the planarizing film 339. The anode electrode 341 may be connected to the source electrode 333 of the thin film transistor 335 through a contact hole passing through the protective film 338 and the planarizing film 339.

The pixel definition film 344 may be formed to cover an edge of the anode electrode 341 on the planarizing film 339 to divide the pixels. In particular, the pixel definition film 344 may define subpixels PX1, PX2, and PX3. Each of the subpixels PX1, PX2, and PX3 is a region, in which the anode electrode 341, the light-emitting layer 342, and the cathode electrode 343 are sequentially stacked, such that holes from the anode electrode 341 and electrons from the cathode electrode 343 are combined with each other in the light-emitting layer 342 to emit light.

The light-emitting layers 342 are formed on the anode electrode 341 and the pixel definition film 344. The light-emitting layer 342 may be an organic light-emitting layer. The light-emitting layer 342 according to an exemplary embodiment may emit short wavelength light, such as blue light or ultraviolet light. A peak wavelength range of blue light may range from about 450 nm to about 490 nm, and a peak wavelength range of ultraviolet light may be less than 450 nm. In this case, the light-emitting layer 342 may be a common layer commonly formed in the subpixels PX1, PX2, and PX3. The display panel 110 according to the illustrated exemplary embodiment may include the light conversion layer QDL configured to convert short wavelength light, such as blue light or ultraviolet light emitted from the light-emitting layer 342 into red light, green light, and blue light, and the color filter layer CFL configured to transmit each of red light, green light, and blue light.

The light-emitting layer 342 may include a hole transporting layer, a light-emitting layer, and an electron transporting layer. In addition, the light-emitting layer 342 may be formed to have a tandem structure of two or more stacks. In this case, a charge generation layer may be formed between the stacks.

The cathode electrode 343 is formed on the light-emitting layer 342. The cathode electrode 343 may be formed to cover the light-emitting layer 342. The cathode electrode 343 may be a common layer commonly formed in the pixels.

The light-emitting element layer EML according to the illustrated exemplary embodiment may be formed as a top emission type, in which light is emitted in a direction of the second substrate 112, e.g., an upward direction. In this case, the anode electrode 341 may be made of metal having high reflectivity, and for example, may include a stacked structure (Ti/Al/Ti) of aluminum and titanium, a stacked structure (ITO/Al/ITO) of aluminum and ITO, a silver-palladium-copper (APC) alloy, and a stacked structure (ITO/APC/ITO) of an APC alloy and ITO. The APC alloy is an alloy of silver (Ag), palladium (Pd), and copper (Cu). In addition, the cathode electrode 343 may be made of a transparent conductive material (TCO) capable of transmitting light, such as ITO or IZO, or may be made of a semi-transmissive conductive material, such as magnesium (Mg), silver (Ag), or an alloy of magnesium (Mg) and silver (Ag). When the cathode electrode 343 is made of the semi-transmissive conductive material, luminous efficiency may be improved due to a microcavity.

An encapsulation film 345 is formed on the light-emitting element layer EML. The encapsulation film 345 may prevent oxygen or moisture from permeating into the light-emitting layer 342 and the cathode electrode 343. To this end, the encapsulation film 345 may include at least one inorganic film. The inorganic film may include silicon nitride, aluminum nitride, zirconium nitride, titanium nitride, hafnium nitride, tantalum nitride, silicon oxide, aluminum oxide, or titanium oxide. In addition, the encapsulation film 345 may further include at least one organic film. The organic layer may be formed to have a sufficient thickness, so as to prevent particles from passing through the encapsulation film 345 and penetrating into the light-emitting layer 342 and the cathode electrode 343. The organic film may include at least one of an epoxy, acrylate, and urethane acrylate.

The color filter layer CFL is disposed on one surface of the second substrate 112 facing the first substrate 111. The color filter layer CFL may include a black matrix 360 and color filters 370.

The black matrix 360 may be formed on one surface of the second substrate 112. The black matrix 360 may be disposed to not overlap the subpixels PX1, PX2, and PX3, and may be disposed to overlap the pixel definition film 344. The black matrix 360 may include a black dye or an opaque metal material, which may block light without transmitting light.

The color filters 370 may be disposed to overlap the subpixels PX1, PX2, and PX3. The color filters 370 may include a first color filters 371 may be disposed to overlap first subpixels PX1, second color filters 372 to overlap second subpixels PX2, and third color filters 373 to overlap third subpixels PX3. In this case, the first color filter 371 may be a first color light transmission filter configured to transmit light with a first color. The second color filter 372 may be a second color light transmission filter configured to transmit light with a second color. The third color filter 373 may be a third color light transmission filter configured to transmit light with a third color. For example, the first color may be a red color, the second color may be a green color, and the third color may be a blue color, without being limited thereto. In this case, a peak wavelength range of red light passing through the first color filter 371 may range from about 620 nm to about 750 nm. A peak wavelength range of green light passing through the second color filter 372 may range from about 500 nm to about 570 nm. A peak wavelength range of blue light passing through the third color filter 373 may range from about 450 nm to about 490 nm.

In addition, edges of two color filters adjacent to each other may overlap the black matrix 360. In this manner, a color mixture that may occur due to light emitted from the light-emitting layer 342 of any one subpixel travelling to a color filter of adjacent subpixel may be prevented by the black matrix 360.

An overcoat layer may be formed on the color filters 370 to planarize stepped portions due to the color filters 370 and the black matrix 360. In some exemplary embodiments, the overcoat layer may be omitted.

The light conversion layer QDL is disposed on the color filter layer CFL. The light conversion layer QDL may include a first capping layer 351, a first light conversion layer 352, a second light conversion layer 353, a third light conversion layer 354, a second capping layer 355, an interlayer organic film 356, and a third capping layer 357.

The first capping layer 351 may be disposed on the color filter layer CFL. The first capping layer 351 may prevent external moisture or oxygen from permeating into the first light conversion layer 352, the second light conversion layer 353, and the third light conversion layer 354 through the color filter layer CFL. The first capping layer 351 may be formed as an inorganic film made of, for example, silicon nitride, aluminum nitride, zirconium nitride, titanium nitride, hafnium nitride, tantalum nitride, silicon oxide, aluminum oxide, or titanium oxide.

The first light conversion layer 352, the second light conversion layer 353, and the third light conversion layer 354 may be disposed above the first capping layer 351.

The first light conversion layer 352 may be disposed to overlap the first subpixel PX1. The first light conversion layer 352 may convert short wavelength light, such as blue light or ultraviolet light, emitted from the light-emitting layer 342 of the first subpixel PX1 into light with the first color. To this end, the first light conversion layer 352 may include a first base resin, a first wavelength shifter, and a first scatterer.

The first base resin may be a material that has high light transmittance and excellent dispersion characteristics with respect to the first wavelength shifter and the first scatterer. For example, the first base resin may include an organic material, such as an epoxy-based resin, an acrylic-based resin, a cardo-based resin, or an imide resin.

The first wavelength shifter may convert or shift a wavelength range of incident light. The first wavelength shifter may include quantum dots, quantum rods, or fluorescent materials. When the first wavelength shifter includes the quantum dots, the quantum dots may be a semiconductor nanocrystal material, and may have a specific band gap according to the composition and the size thereof. As such, the first wavelength shifter may absorb incident light and then emit light having an intrinsic wavelength. Furthermore, the first wavelength shifter may have a core-shell structure, which includes a core including nanocrystals and a shell surrounding the core. In particular, the nanocrystals forming the core may include IV group-based nanocrystals, II-VI group-based compound nanocrystals, III-V group-based compound nanocrystals, IV-VI group-based nanocrystals, or combinations thereof. The shell may function as a protective layer, which prevents chemical modification of the core and maintains semiconductor properties, and/or may function as a charging layer, which imparts electrophoretic properties to the quantum dots. In addition, the shell may be a single layer or a multi-layer. The shell may include metal or nonmetal oxide, a semiconductor compound, or a combination thereof.

The first scatterer may have a refractive index different from that of the first base resin, and may form an optical interface with the first base resin. For example, the first scatterer may include light scattering particles. For example, the first scatterer may include metal oxide particles, such as titanium oxide ($TiO_2$), silicon oxide ($SiO_2$), zirconium oxide ($ZrO_2$), aluminum oxide ($Al_2O_3$), indium oxide ($In_2O_3$), zinc oxide (ZnO), or tin oxide ($SnO_2$). Alternatively, the first scatterer may include organic particles, such as an acrylic-based resin or a urethane-based resin.

The first scatterer may scatter incident light in a random direction without substantially changing a wavelength of light passing through the first light conversion layer 352. Accordingly, a path length of light passing through the first light conversion layer 352 may be increased, and thus, color conversion efficiency may be increased due to the first wavelength shifter.

In addition, the first light conversion layer 352 may overlap the first color filter 371. As such, a portion of short wavelength light, such as blue light or ultraviolet light provided from the first subpixel PX1, may not be converted into light with the first color by the first wavelength shifter, and may pass through the first light conversion layer 352 intact. However, the short wavelength light, such as the blue light or the ultraviolet light, which is not converted by the first light conversion layer 352 and is incident on the first color filter 371, may not pass through the first color filter 371. In contrast, light with the first color converted by the first light conversion layer 352 may pass through the first color filter 371, and thus, be emitted in the direction of the second substrate 112.

The second light conversion layer 353 may be disposed to overlap the second subpixel PX2. The second light conversion layer 353 may convert short wavelength light, such as blue light or ultraviolet light emitted from the light-emitting layer 342 of the second subpixel PX2, into light with the second color. To this end, the second light conversion layer 353 may include a second base resin, a second wavelength shifter, and a second scatterer. Since the second base resin, the second wavelength shifter, and the second scatterer of the second light conversion layer 353 are substantially the same as those described in the first light conversion layer 352, repeated descriptions thereof will be omitted. However, when the first wavelength shifter and the second wavelength shifter include quantum dots, a diameter of the second wavelength shifter may be smaller than a diameter of the first shifter.

In addition, the second light conversion layer 353 may overlap the second color filter 372. As such, a portion of short wavelength light, such as blue light or ultraviolet light provided from the second subpixel PX2, may not be converted into light with the second color by the second wavelength shifter, and may pass through the second light conversion layer 353 intact. However, the short wavelength light, such as the blue light or the ultraviolet light, which is not converted by the second light conversion layer 353 and is incident on the second color filter 372, may not pass through the second color filter 372. In contrast, light with the second color converted by the second light conversion layer 353 may pass through the second color filter 372, and thus, be emitted in the direction of the second substrate 112.

The third light conversion layer 354 may be disposed to overlap the third subpixel PX3. The third light conversion layer 354 may convert short wavelength light, such as blue light or ultraviolet light emitted from the light-emitting layer 342 of the third subpixel PX3, into light with the third color. To this end, the third light conversion layer 354 may include a third base resin and a third scatterer. Since the third base resin and the third scatterer of the third light conversion layer 354 are substantially the same as those described in the first light conversion layer 352, repeated descriptions thereof will be omitted.

In addition, the third light conversion layer 354 may overlap the third color filter 373. As such, short wavelength light, such as blue light or ultraviolet light provided from the third subpixel PX3, may pass through the third light conversion layer 354 intact. Light passing through the third light conversion layer 354 may pass through the third color filter 373, and thus, be emitted to the direction of the second substrate 112.

The second capping layer 355 may be disposed on the first light conversion layer 352, the second light conversion layer 353, the third light conversion layer 354, and the first capping layer 351, which is not covered by the light conversion layers 352, 353, and 354 and is exposed. The second capping layer 355 may prevent external moisture or oxygen from permeating into the first light conversion layer 352, the second light conversion layer 353, and the third light conversion layer 354. The second capping layer 355 may be formed as an inorganic film including, for example, silicon nitride, aluminum nitride, zirconium nitride, titanium nitride, hafnium nitride, tantalum nitride, silicon oxide, aluminum oxide, or titanium oxide.

The interlayer organic film 356 may be disposed on the second capping layer 355. The interlayer organic film 356 may be a planarizing layer, which planarizes stepped portions due to the light conversion layers 352, 353, and 354. The interlayer organic film 356 may be formed as an organic film including an acryl resin, an epoxy resin, a phenolic resin, a polyamide resin, a polyimide resin, or the like.

The third capping layer 357 may be disposed on the interlayer organic film 356. The third capping layer 357 may be formed as an inorganic film including, for example, silicon nitride, aluminum nitride, zirconium nitride, titanium nitride, hafnium nitride, tantalum nitride, silicon oxide, aluminum oxide, or titanium oxide.

The filler FL may be disposed between the thin film encapsulation layer TFEL disposed on the first substrate 111 and the third capping layer 357 disposed on the second substrate 112. The filler FL may include a material having a buffering function. For example, the filler FL may be formed as an organic film including an acryl resin, an epoxy resin, a phenolic resin, a polyamide resin, a polyimide resin, or the like.

A sealing material for attaching the first substrate 111 and the second substrate 112 may be disposed in the non-display region of the display panel 110. When viewed from the above, the filler FL may be surrounded by the sealing material. The sealing material may be glass frit or a sealant, for example.

According to the illustrated exemplary embodiment shown in FIG. 5, the first, second, and third subpixels PX1, PX2, and PX3 emit short wavelength light, such as blue light or ultraviolet light. Light of the first subpixel PX1 may be converted into light with the first color through the first light conversion layer 352, and then be output through the first color filter 371, light of the second subpixel PX2 may be converted into light with the second color through the second light conversion layer 353, and thus be output through the second color filter 372, and light of the third subpixel PX3 may be output through the third light conversion layer 354 and the third color filter 373, thereby emitting white color light.

In addition, according to the illustrated exemplary embodiment shown in FIG. 5, since the subpixels PX1, PX2, and PX3 are formed as a top emission type, in which light is emitted in the direction of the second substrate 112, e.g., an upward direction, the heat dissipation film 130 including an opaque material, such as graphite or aluminum, may be disposed on one surface of the first substrate 111.

Figure 6:
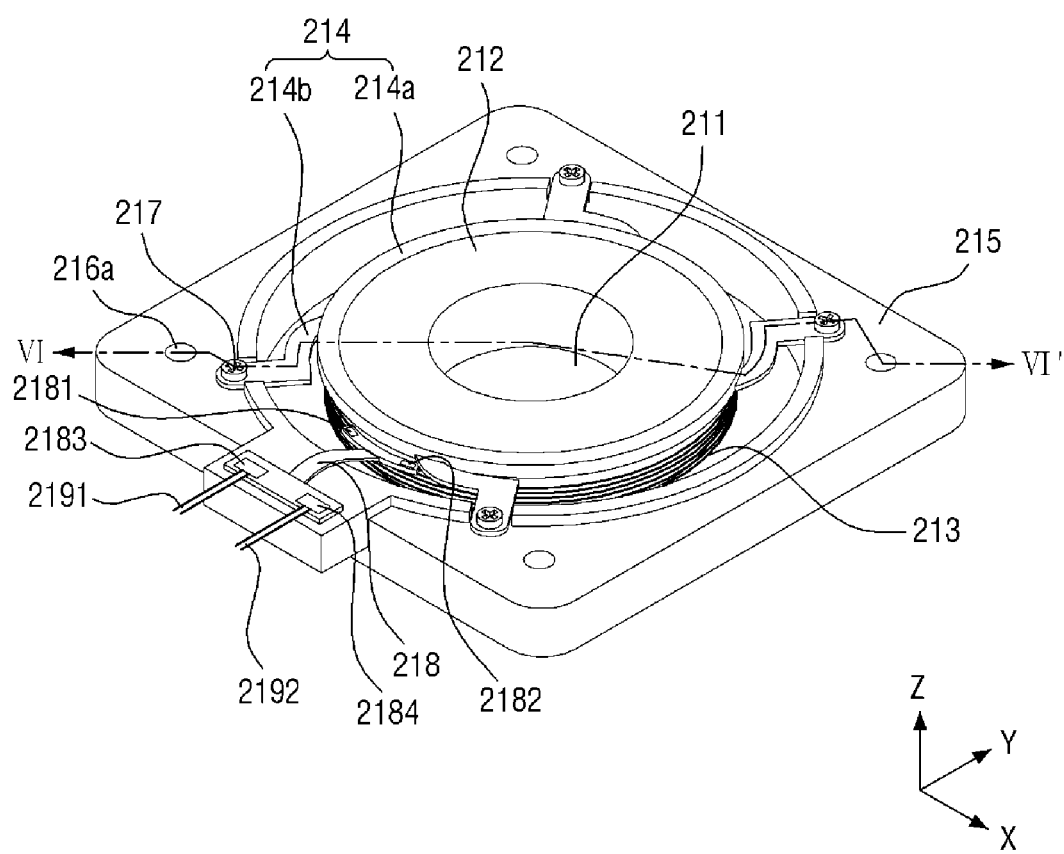
FIG. 6 is a perspective view of a first sound generation device of FIG. 4 according to an exemplary embodiment.
Figure 7:
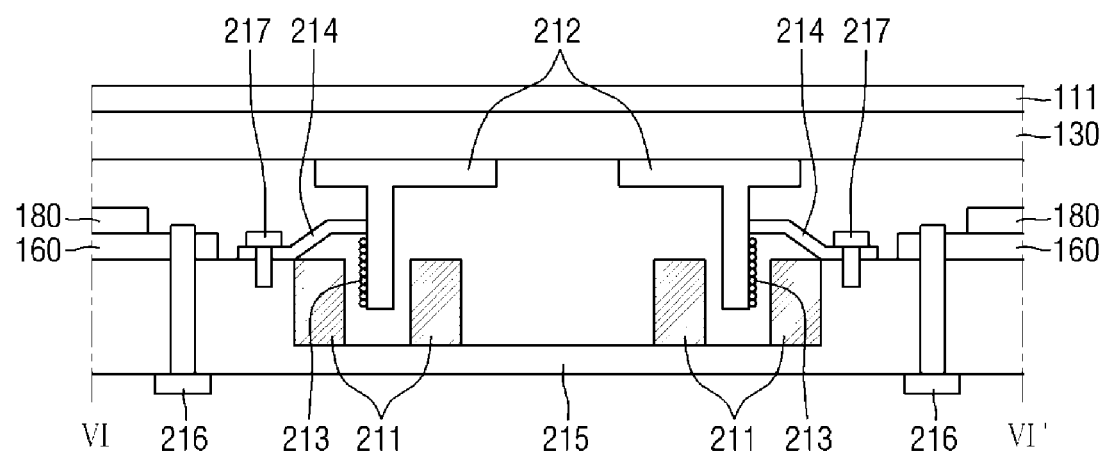
FIG. 7 is a cross-sectional view taken along line VI-VI' of FIG. 6 according to an exemplary embodiment.
Figure 8:
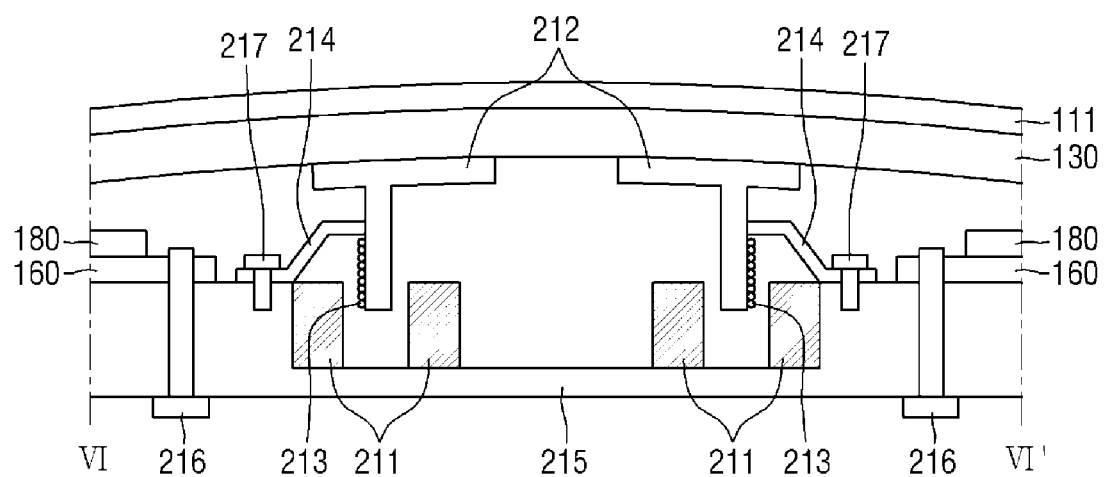
FIGS. 8 and 9 are views illustrating vibration of the display panel by the first sound generation device according to exemplary embodiments.
Figure 9:
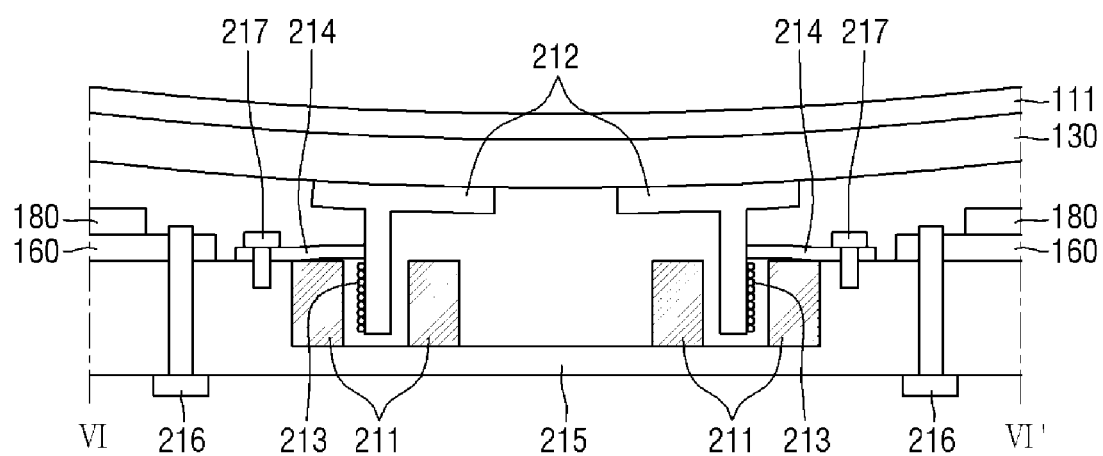

FIG. 6 is a perspective view of the first sound generation device of FIG. 4 according to an exemplary embodiment. FIG. 7 is a cross-sectional view taken along line VI-VI' of FIG. 6. FIGS. 8 and 9 are exemplary views illustrating vibration of the display panel by the first sound generation device.

Referring to FIGS. 6 to 9, the first sound generation device 210 may be an exciter, which vibrates the display panel 110 by generating a magnetic force using a voice coil. The first sound generation device 210 may include the magnet 211, the bobbin 212, the voice coil 213, a damper 214, the plate 215, first fixing members 216, second fixing members 217, and a connection unit 218.

The magnet 211 may be a permanent magnet, and may include a sintered magnet, such as barium ferrite. A material of the magnet 211 may include ferric oxide ($Fe_2O_3$), barium carbonate ($BaCO_3$), a neodymium magnet, strontium ferrite with an improved magnet component, an alloy cast magnet including aluminum (Al), nickel (Ni), and cobalt (Co), or the like, without being limited thereto. The neodymium magnet may be, for example, neodymium-iron-boron (Nd—Fe—B).

The magnets 211 may be disposed to inner and outer sides of the bobbin 212. The bobbin 212 may be disposed between adjacent magnets 211. The magnet 211 and the bobbin 212 may be spaced apart from each other by a certain interval.

The magnet 211 disposed to the inner side of the bobbin 212 and the magnet 211 disposed to the outer side of the bobbin 212 may have different magnetic properties. For example, the magnet 211 disposed inside the bobbin 212 may have N-magnetic pole, and the magnet 211 disposed outside the bobbin 212 may have S-magnetic pole. An external magnetic field may be formed between the magnet 211 disposed inside the bobbin 212 and the magnet 211 disposed outside the bobbin 212.

The bobbin 212 may be formed to have substantially a cylindrical shape. The magnets 211 may be disposed to the inner and outer sides of the bobbin 212. More particularly, the bobbin 212 may be disposed to surround the magnet 211 disposed inside the bobbin 212. The magnet 211 disposed outside the bobbin 212 may be disposed to surround the bobbin 212. The bobbin 212 may be made of a material produced by processing pulp or paper, aluminum, magnesium, an alloy thereof, a synthetic resin, such as polypropylene, a polyamide-based fiber, or the like. One end of the bobbin 212 may be attached to the heat dissipation film 130 using an adhesive member. The adhesive member may be double-sided tape, for example.

The voice coil 213 is wrapped (or wound) on an outer circumferential surface of the bobbin 212. One end of the voice coil 213 may be connected to a first connection terminal 2181 of the connection unit 218, and the other end of the voice coil 213 may be connected to a second connection terminal 2182 of the connection unit 218.

The damper 214 is disposed between the bobbin 212 and the plate 215. The damper 214 may include a first damper portion 214a disposed to surround the bobbin 212 and fixed to the bobbin 212, and a second damper portion 214b fixed to the plate 215 through a second fixing member 217, such as a screw. The first damper portion 214a and the second damper portion 214b may be connected to each other. In some exemplary embodiments, the first sound generation device 210 may include a plurality of second damper portions 214b.

Each of the second fixing members 217 may be inserted in and fixed to a damper hole of the damper 214 and a second fixing hole of the plate 215. The damper hole of the damper 214 and the second fixing hole of the plate 215 may be screw holes, into which a screw may be fixed. The damper hole of the damper 214 may be a hole passing through the damper 214, and the second fixing hole of the plate 215 may be a hole passing through the plate 215, or a hole formed by perforating a portion of the plate 215.

The damper 214 may have elasticity, and may be made of a conductive material. The damper 214 may contract and expand according to a vertical movement of the bobbin 212 to adjust vertical vibration of the bobbin 212. More particularly, since the damper 214 is connected to the bobbin 212 and the plate 215, the vertical movement of the bobbin 212 may be limited by a restoring force of the damper 214. For example, when the bobbin 212 vibrates upward beyond a certain level, or vibrates downward beyond a certain level, the bobbin 212 may return to its original position due to the restoring force of the damper 214.

The plate 215 may be disposed on a lower surface of the magnet 211 disposed inside the bobbin 212. The plate 215 may be disposed on a lower surface and side surfaces of the magnet 211 disposed outside the bobbin 212. The plate 215 may be formed integrally with the magnet 211 or formed separately from the magnet 211. When the plate 215 is formed separately from the magnet 211, the magnet 211 may be attached to the plate 215 through double-sided tape or an adhesive member, such as a pressure sensitive adhesive.

The plate 215 may be fixed to the control circuit board 160 through the first fixing members 216, such as screws. More particularly, each of the first fixing members 216 may be inserted in and fixed to a first fixing hole 216a of the plate 215 and a board hole of the control circuit board 160. The first fixing hole 216a of the plate 215 and the board hole of the control circuit board 160 may be screw holes, into which a screw may be fixed. The first fixing hole 216a of the plate 215 may be a hole passing through the plate 215, and the board hole of the control circuit board 160 may be a hole passing through the control circuit board 160, or a hole formed by perforating a portion of the control circuit board 160.

A fixing direction of each of the first fixing members 216 may be opposite to a fixing direction of each of the second fixing members 217. For example, as shown in FIG. 7, each of the first fixing members 216 may be fixed in the second direction (Y-axis direction), and each of the second fixing members 217 may be fixed in a direction opposite to the second direction (Y-axis direction).

The first hole H1 may be formed in a region of the control circuit board 160, in which the magnet 211 is disposed. The second hole H2 may be formed in a region of the bottom cover 180, in which the magnet 211 is disposed. The size of the first hole H1 may be smaller than the size of the second hole H2.

The connection unit 218 may include the first connection terminal 2181 and the second connection terminal 2182, which are disposed adjacent to the voice coil 213 wound on the bobbin 212, and a third connection terminal 2183 and a fourth connection terminal 2184, which are disposed on the plate 215. The first connection terminal 2181 and the third connection terminal 2183 may be electrically connected, and the second connection terminal 2182 and the fourth connection terminal 2184 may be electrically connected. Each of the first connection terminal 2181 and the third connection terminal 2183 may be electrically insulated from the second connection terminal 2182 and the fourth connection terminal 2184. Each of the second connection terminal 2182 and the fourth connection terminal 2184 may be electrically insulated from the first connection terminal 2181 and the third connection terminal 2183.

The first connection terminal 2181 may be connected to one end of the voice coil 213, and the second connection terminal 2182 may be connected to the other end of the voice coil 213. The first connection terminal 2181 and one end of the voice coil 213 may be connected to each other through soldering, for example. The second connection terminal 2182 and the other end of the voice coil 213 may be connected to each other through soldering, for example.

The third connection terminal 2183 may be connected to a first sound connection wiring 2191, and the fourth connection terminal 2184 may be connected to a second sound connection wiring 2192. The first sound connection wiring 2191 may be connected to the first sound wiring 161 of the control circuit board 160, and the second sound connection wiring 2192 may be connected to the second sound wiring 162 of the control circuit board 160. The third connection terminal 2183 and the first sound connection wiring 2191 may be connected to each other through soldering, for example. The fourth connection terminal 2184 and the second sound connection wiring 2192 may be connected to each other through soldering, for example.

One end of the voice coil 213 may be electrically connected to the sound driving circuit 171 through the first sound wiring 161, the first sound connection wiring 2191, the third connection terminal 2183, and the first connection terminal 2181, and thus, may receive the first driving voltage from the sound driving circuit 171. The other end of the voice coil 213 may be electrically connected to the second sound wiring 162, the second sound connection wiring 2192, the fourth connection terminal 2184, and the second connection terminal 2182, and thus, may receive the second driving voltage from the sound driving circuit 171. A current may flow in the voice coil 213 according to the first driving voltage and the second driving voltage. An applied magnetic field may be formed around the voice coil 213 according to the current flowing in the voice coil 213. A direction of a current flowing in the voice coil 213, when the first driving voltage is a positive voltage and the second driving voltage is a negative voltage, may be opposite to a direction of a current flowing in the voice coil 213, when the first driving voltage is a negative voltage and the second driving voltage is a positive voltage. As such, an N-pole and an S-pole of the applied magnetic field formed around the voice coil 213 are changed according to alternating current (AC) driving of the first driving voltage and the second driving voltage, and thus, an attractive force and a repulsive force are alternately applied to the magnet 211 and the voice coil 213. In this manner, as shown in FIGS. 8 and 9, the bobbin 212, on which the voice coil 213 is wound, may reciprocate in the third direction (Z-axis direction). As such, as shown in FIGS. 8 and 9, the display panel 110 may be vibrated in the third direction (Z-axis direction), and thus, sound may be output.

The plate 215 has been described as being fixed to the control circuit board 160, however, the inventive concepts are not limited thereto. For example, in some exemplary embodiments, the plate 215 may be fixed to a system circuit board, a power circuit board, a sound circuit board, or a dummy circuit board, instead of the control circuit board 160. The dummy circuit board may refer to a circuit board, on which other components are not disposed, excluding the magnet 211 and the plate 215 of the first sound generation device 210, and the amplifier which amplifies the first sound signal provided to the first sound generation device 210. The dummy circuit board may be a flexible printed circuit board or a printed circuit board.

According to the illustrated exemplary embodiment shown in FIGS. 6 to 9, the bobbin 212 is fixed to the first substrate 111 or the heat dissipation film 130. The plate 215 to which the magnet 211 is coupled is fixed to the circuit board. The circuit board is fixed to the bottom cover 180. Since the bottom cover 180 supporting the magnet 211 is rigid as compared with the display panel 110, the bobbin 212, on which the voice coil 213 is wound, may reciprocate from the fixed magnet 211 according to an applied magnetic field. As the bobbin 212 reciprocates, the display panel 110 may be vibrated in the third direction (Z-axis direction) as shown in FIGS. 8 and 9, and thus, sound may be output.

Figure 10:
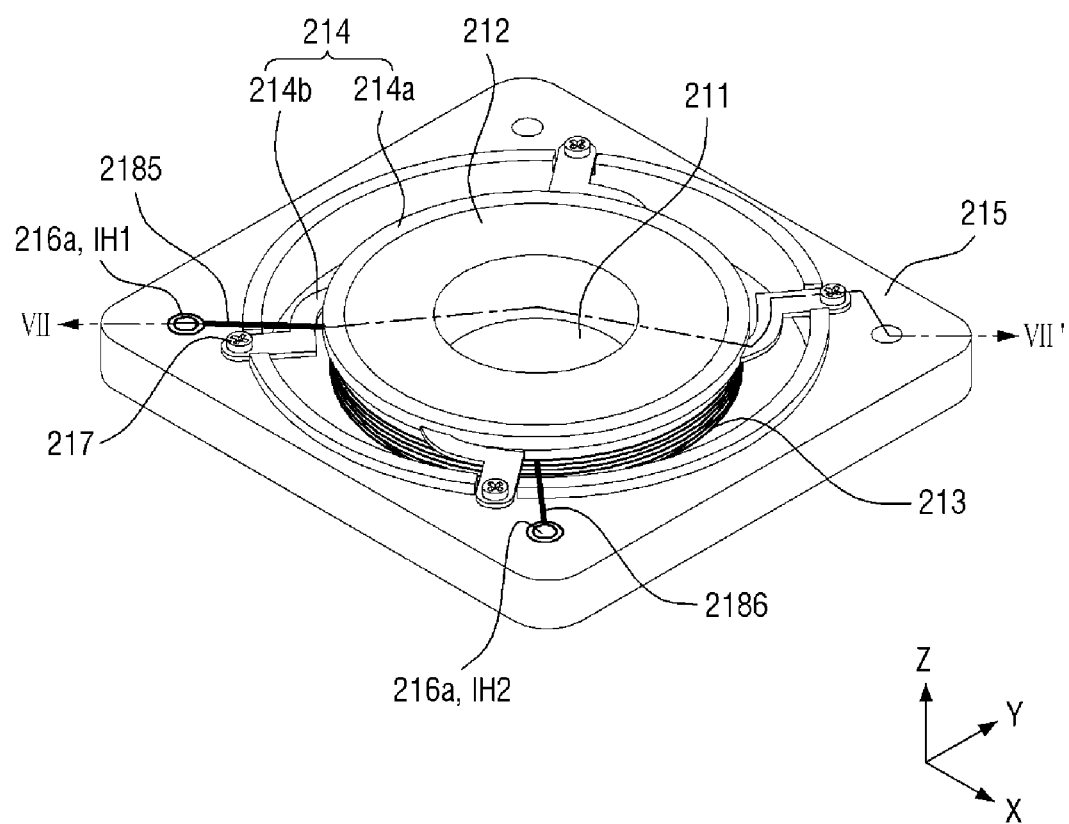
FIG. 10 is a perspective view of a first sound generation device of FIG. 4 according to an exemplary embodiment.
Figure 11B:
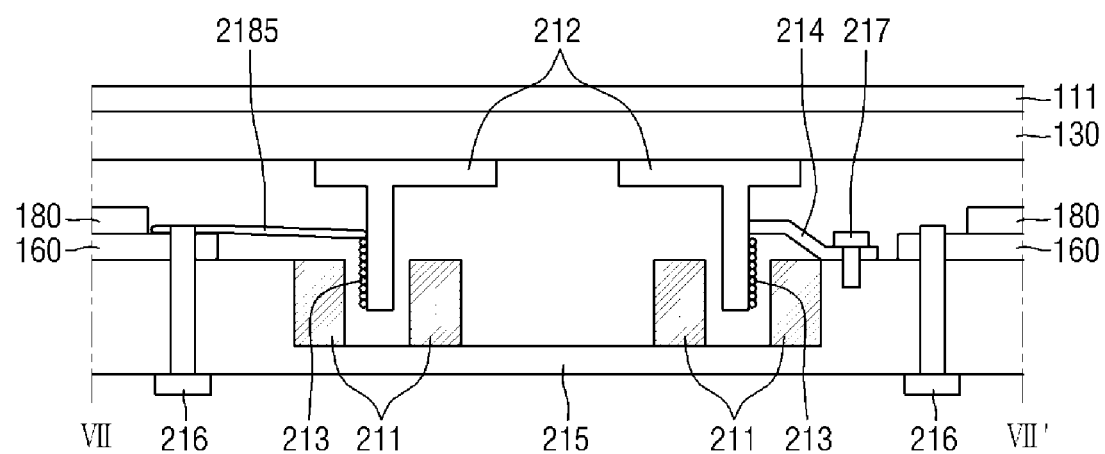
FIG. 11B is a cross-sectional view taken along line VII-VII' of FIG. 10 according to an exemplary embodiment.

FIG. 10 is a perspective view of the first sound generation device of FIG. 4 according to another exemplary embodiment. FIG. 11A is an enlarged plan view illustrating the first hole and board holes of the control circuit board. FIG. 11b is a cross-sectional view taken along line VII-VII' of FIG. 10.

The first sound generation device according to the illustrated exemplary embodiment of FIGS. 10, 11A, and 11B is different from that shown in FIGS. 6 and 7, in that a first connection line 2185 and a second connection line 2186 are added, instead of the connection unit 218.

Referring to FIGS. 10, 11A, and 11B, the first connection line 2185 electrically connects one end of the voice coil 213 and any one first fixing member 216 of the first fixing members 216. One end of the first connection line 2185 may be connected to one end of the voice coil 213, and the other end of the first connection line 2185 may be connected to any one first fixing member 216 of the first fixing members 216. The other end of the first connection line 2185 may be connected by being wrapped or wound on the first fixing member 216. Alternatively, as shown in FIG. 10, the other end of the first connection line 2185 may be formed to have a first circular insertion hole IH1, into which the first fixing member 216 is inserted.

The first connection line 2185 may have substantially the same component as the voice coil 213. In this case, the first connection line 2185 may refer to a component extending from one end of the voice coil 213. Alternatively, the first connection line 2185 may be a separate component from the voice coil 213. In this case, the first connection line 2185 may be connected to one end of the voice coil 213 through soldering or electrical insulating tape.

The second connection line 2186 electrically connects the other end of the voice coil 213 and another first fixing member 216 of the first fixing members 216. One end of the second connection line 2186 is connected to the other end of the voice coil 213, and the other end of the second connection line 2186 is connected to another first fixing member 216 of the first fixing members 216. The other end of the second connection line 2186 may be connected to be wrapped or wound on the first fixing member 216. Alternatively, as shown in FIG. 10, the other end of the second connection line 2186 may be formed to have a second circular insertion hole IH2, into which the first fixing member 216 is inserted.

The second connection line 2186 may have substantially the same component as the voice coil 213. In this case, the second connection line 2186 may refer to a component extending from one end of the voice coil 213. Alternatively, the second connection line 2186 may be a separate component from the voice coil 213. In this case, the second connection line 2186 may be connected to the other end of the voice coil 213 through soldering or electrical insulating tape As shown in FIG. 11A, the first sound wiring 161 may be disposed on a first board hole BH1, in which any one first fixing member 216 of the first fixing members 216 is inserted. In order to facilitate connection between the first sound wiring 161 and the first fixing member 216, one end of the first sound wiring 161 may be formed to have a third circular insertion hole IH3, into which the first fixing member 216 is inserted.

As shown in FIG. 11A, the second sound wiring 162 may be disposed on a second board hole BH2, in which any one fixing member 216 of the first fixing members 216 is inserted. In order to facilitate connection between the second sound wiring 162 and the first fixing member 216, one end of the second sound wiring 162 may be formed to have a fourth circular insertion hole IH4, into which the first fixing member 216 is inserted.

One end of the voice coil 213 may receive the first driving voltage from the sound driving circuit 171 through the first sound wiring 161, the first fixing member 216, and the first connection line 2185. The other end of the voice coil 213 may receive the second driving voltage from the sound driving circuit 171 through the second sound wiring 162, the second sound connection wiring 2192, the first fixing member 216, and the second connection line 2186. A current may flow in the voice coil 213 according to the first driving voltage and the second driving voltage. An applied magnetic field may be formed around the voice coil 213 according to the current flowing in the voice coil 213. A direction of a current flowing in the voice coil 213, when the first driving voltage is a positive voltage and the second driving voltage is a negative voltage, may be opposite to a direction of a current flowing in the voice coil 213, when the first driving voltage is a negative voltage and the second driving voltage is a positive voltage. As such, an N-pole and an S-pole of the applied magnetic field formed around the voice coil 213 are changed according to AC driving of the first driving voltage and the second driving voltage, and thus, an attractive force and a repulsive force are alternately applied to the magnet 211 and the voice coil 213. In this manner, the bobbin 212 on which the voice coil 213 is wound may reciprocate in the third direction (Z-axis direction). As such, the display panel 110 may be vibrated in the third direction (Z-axis direction), and thus, sound may be output.

According to the illustrated exemplary embodiment shown in FIGS. 10, 11A, and 11B, since the first sound wiring 161 is connected directly to any one first fixing member 216 of the first fixing members 216, the connection unit 218 may be omitted as compared with that shown in FIGS. 6 and 7, which may simplify manufacturing process, such as obviating at least one soldering process. In addition, since the second sound wiring 162 is connected directly to another first fixing member 216 of the first fixing members 216, the connection unit 218 may be omitted as compared with that shown in FIGS. 6 and 7, which may simplify manufacturing process, such as obviating at least one soldering process.

Figure 12:
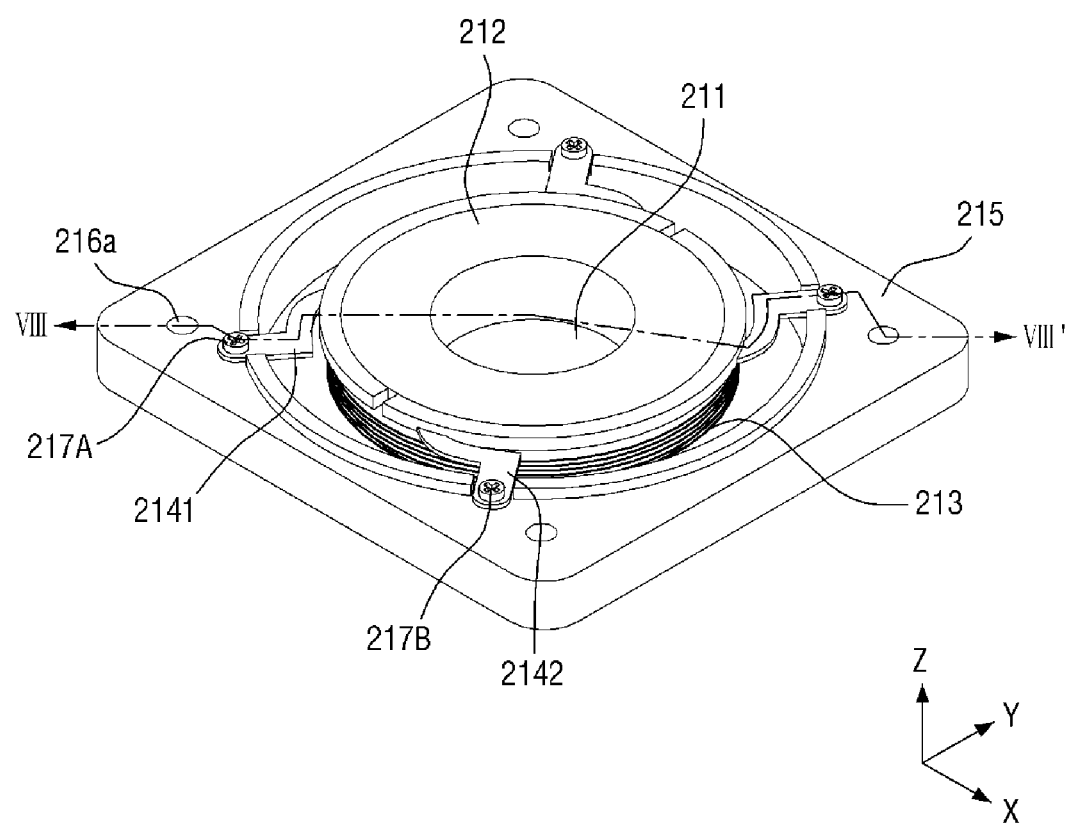
FIG. 12 is a perspective view of a first sound generation device of FIG. 4 according to an exemplary embodiment.
Figure 13:
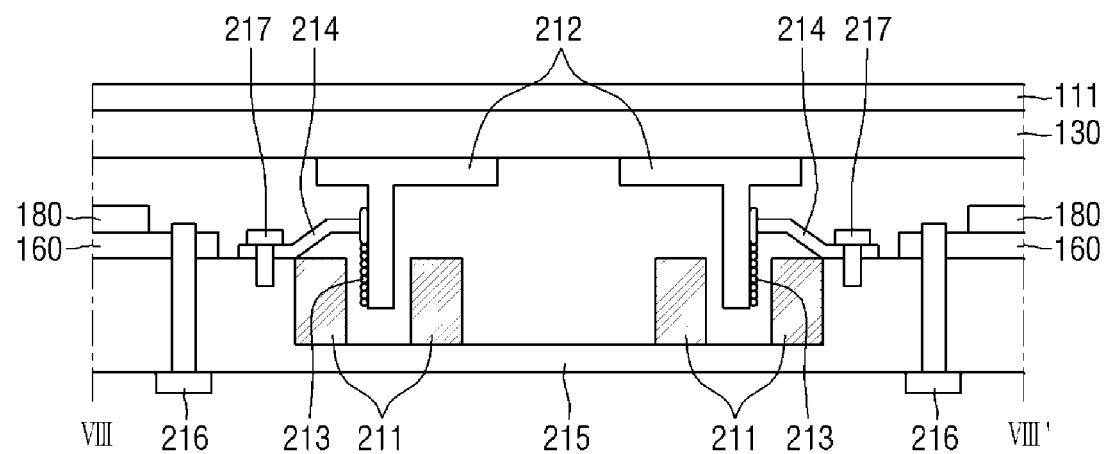
FIG. 13 is a cross-sectional view of an example which is taken along line VIII-VIII' of FIG. 12.

FIG. 12 is a perspective view of the first sound generation device of FIG. 4 according to still another exemplary embodiment. FIG. 13 is a cross-sectional view taken along line VIII-VIII' of FIG. 12.

The first sound generation device according to the illustrated exemplary embodiment shown in FIGS. 12 and 13 is different from that shown in FIGS. 6 and 7, in that, instead of the connection unit 218, one end of the voice coil 213 is connected to a first damper 2141, the other end of the voice coil 213 is connected to a second damper 2142, the first sound wiring 161 is electrically connected to the first damper 2141, and the second sound wiring 162 is electrically connected to the second damper 2142.

Referring to FIGS. 12 and 13, the first damper 2141 may be disposed between the bobbin 212 and the plate 215, and the second damper 2142 may be disposed between the bobbin 212 and the plate 215. When the first damper 2141 is disposed adjacent to a left side of the plate 215, the second damper 2142 may be disposed adjacent to a right side of the plate 215. Alternatively, when the first damper 2141 is disposed adjacent to an upper side of the plate 215, the second damper 2142 may be disposed adjacent to a lower side of the plate 215. The first damper 2141 and the second damper 2142 may be physically spaced apart from each other.

The first damper 2141 may be fixed to the plate 215 at one side of the plate 215 through at least one secondary fixing member 217A, such as a screw. More particularly, at least one secondary fixing member 217A may be inserted in and fixed to a first damper hole of the first damper 2141, and a secondary fixing hole of the plate 215. The first damper hole of the first damper 2141 and the secondary fixing hole of the plate 215 may be screw holes, into which a screw may be fixed. The first damper hole of the first damper 2141 may be a hole passing through the first damper 2141, and the secondary fixing hole of the plate 215 may be a hole passing through the plate 215, or a hole formed by perforating a portion of the plate 215.

The second damper 2142 may be fixed to the plate 215 at the other side of the plate 215 through at least one secondary fixing member 217B, such as a screw. More particularly, at least one secondary fixing member 217B may be inserted in and fixed to a second damper hole of the second damper 2142 and another secondary fixing hole of the plate 215. The second damper hole of the second damper 2142 and the another secondary fixing hole of the plate 215 may be screw holes, into which a screw may be fixed. The second damper hole of the second damper 2142 may be a hole passing through the second damper 2142, and the another secondary fixing hole of the plate 215 may be a hole passing through the plate 215, or a hole formed by perforating a portion of the plate 215.

Each of the first damper 2141 and the second damper 2142 may have elasticity, and may be made of a conductive material. Each of the first damper 2141 and the second damper 2142 may contract and expand according to a vertical movement of the bobbin 212 to adjust vertical vibration of the bobbin 212. More particularly, since each of the first damper 2141 and the second damper 2142 is connected to the bobbin 212 and the plate 215, the vertical movement of the bobbin 212 may be limited by restoring forces of the first damper 2141 and the second damper 2142. For example, when the bobbin 212 vibrates upward beyond a certain level or vibrates downward beyond a certain level, the bobbin 212 may return to its original position due to the restoring forces of the first damper 2141 and the second damper 2142.

The first damper 2141 may be connected to one end of the voice coil 213. For example, as shown in FIG. 13, one end of the voice coil 213 may be wound on the first damper 2141. The second damper 2142 may be connected to the other end of the voice coil 213. For example, the other end of the voice coil 213 may be wound on the second damper 2142. The bobbin 212 may be made of a non-conductive material, so that the first damper 2141 and the second damper 2142 may be electrically insulated from each other. The first driving voltage may be applied to one end of the voice coil 213 through the first damper 2141, and the second driving voltage may be applied to the other end of the voice coil 213 through the second damper 2142.

The first sound wiring 161 may be connected to at least one secondary fixing member 217A for fixing the first damper 2141. In order to facilitate connection between the first sound wiring 161 and the secondary fixing member 217A, one end of the first sound wiring 161 may be formed to have a circular insertion hole, into which the secondary fixing member 217A is inserted.

The second sound wiring 162 may be connected to at least one secondary fixing member 217B for fixing the second damper 2142. In order to facilitate connection between the first sound wiring 161 and the secondary fixing member 217B, one end of the second sound wiring 162 may be formed to have a circular insertion hole, into which the secondary fixing member 217B is inserted.

One end of the voice coil 213 may receive the first driving voltage from the sound driving circuit 171 through the first sound wiring 161, the secondary fixing member 217A, and the first damper 2141. The other end of the voice coil 213 may receive the second driving voltage from the sound driving circuit 171 through the second sound wiring 162, the secondary fixing member 217B, and the second damper 2142. A current may flow in the voice coil 213 according to the first driving voltage and the second driving voltage. An applied magnetic field may be formed around the voice coil 213 according to the current flowing in the voice coil 213. A direction of a current flowing in the voice coil 213, when the first driving voltage is a positive voltage and the second driving voltage is a negative voltage, may be opposite to a direction of a current flowing in the voice coil 213, when the first driving voltage is a negative voltage and the second driving voltage is a positive voltage. As such, an N-pole and an S-pole of the applied magnetic field formed around the voice coil 213 are changed according to AC driving of the first driving voltage and the second driving voltage, and thus, an attractive force and a repulsive force are alternately applied to the magnet 211 and the voice coil 213. As such, the bobbin 212, on which the voice coil 213 is wound, may reciprocate in the third direction (Z-axis direction). In this manner, the display panel 110 may be vibrated in the third direction (Z-axis direction), and thus, sound may be output.

According to the illustrated exemplary embodiment shown in FIGS. 12 and 13, since the first sound wiring 161 is connected to the secondary fixing member 217A, the connection unit 218 may be omitted as compared with that shown in FIGS. 6 and 7, thereby simplifying manufacturing process, such as obviating at least one soldering process. In addition, since the second sound wiring 162 is connected to the secondary fixing member 217B, the connection unit 218 may be omitted as compared with that shown in FIGS. 6 and 7, thereby simplifying manufacturing process, such as obviating at least one soldering process.

Figure 14:
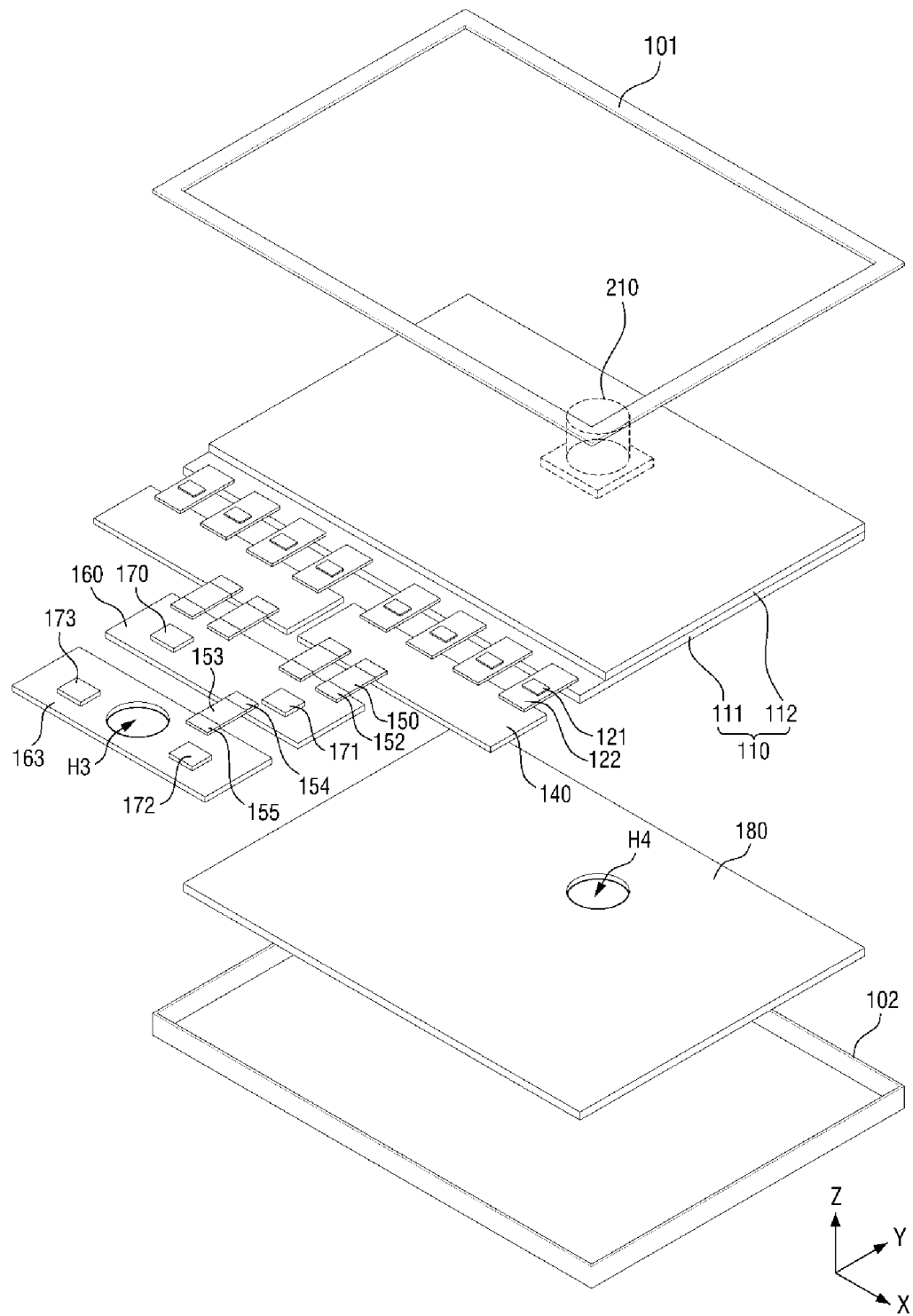
FIG. 14 is an exploded perspective view of a display device according to an exemplary embodiment.
Figure 15:
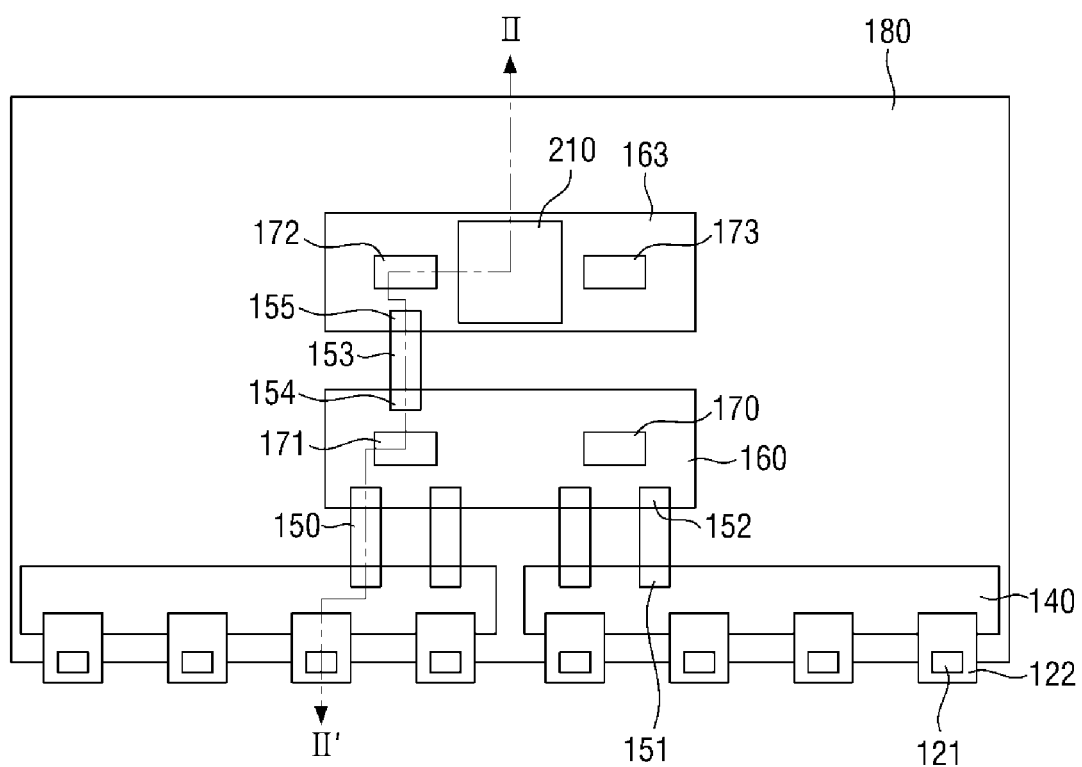
FIG. 15 is a bottom view illustrating a display device according to an exemplary embodiment.
Figure 15:
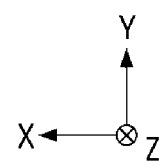
Figure 16:
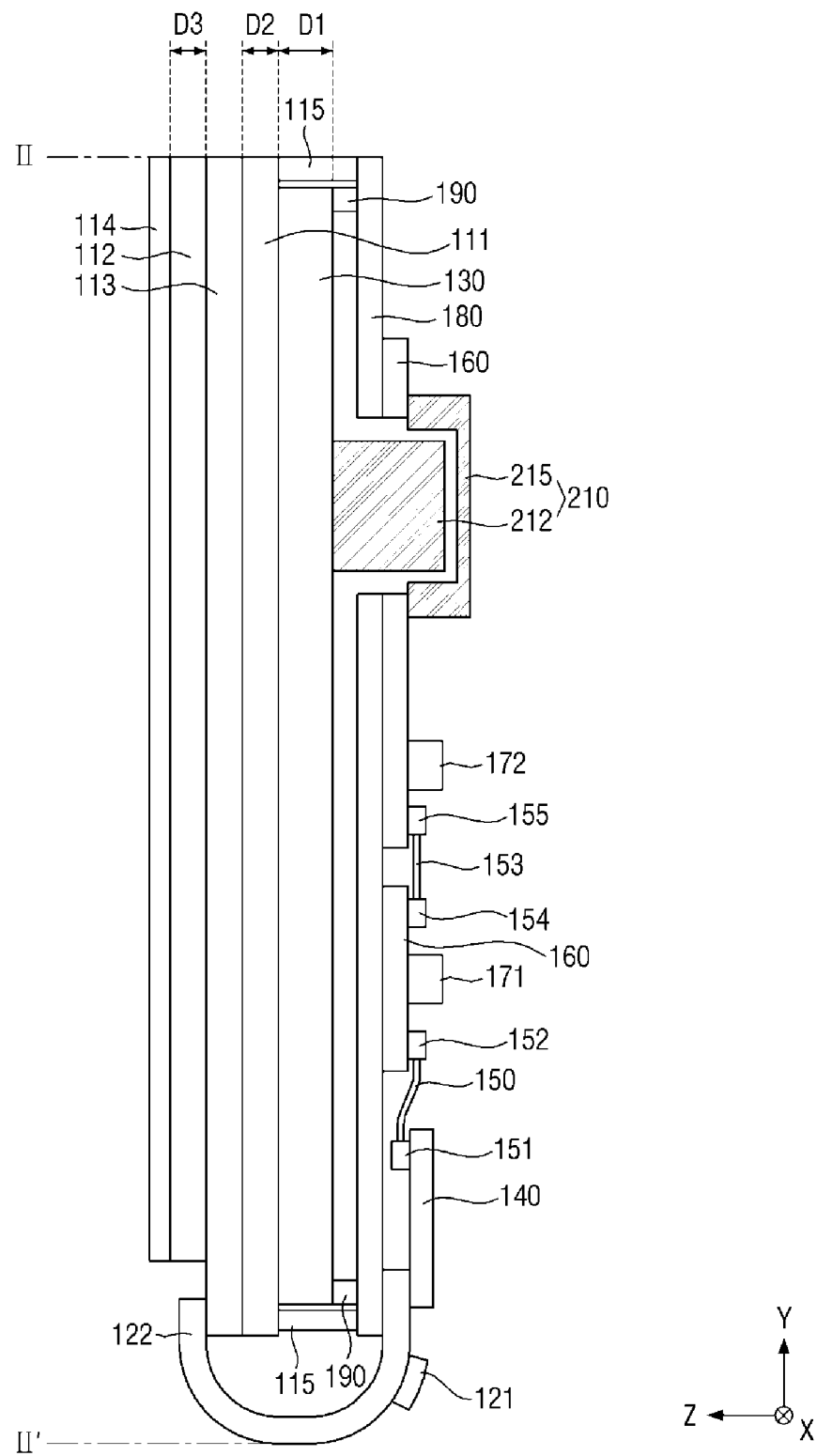
FIG. 16 is a cross-sectional view taken along line II-IF of FIG. 14 according to an exemplary embodiment.

FIG. 14 is an exploded perspective view of a display device according to an exemplary embodiment. FIG. 15 is a bottom view of a display device according to an exemplary embodiment. FIG. 16 is a cross-sectional view taken along line II-IF of FIG. 14.

The display device shown in FIGS. 14 to 16 is different from that shown in FIGS. 2, 3, and 4, in that a first sound generation device 210 is fixed to another circuit board other than a control circuit board 160. For convenience of description, only a bobbin 212 and a plate 215 of the first sound generation device 210 are illustrated in FIG. 16.

Referring to FIGS. 14 to 16, a system circuit board 163 may be connected to the control circuit board 160 through a second cable 153. The system circuit board 163 may be disposed at one side of the control circuit board 160. For example, as shown in FIGS. 14 and 15, the system circuit board 163 may be disposed at a side opposite to a first side of the control circuit board 160, at which second connectors 152 and the first cables 150 are disposed.

The control circuit board 160 may include a third connector 154 connected to the second cable 153, and the system circuit board 163 may include a fourth connector 155 connected to the second cable 153. The system circuit board 163 may be a flexible printed circuit board or a printed circuit board. The second cable 153 may be a flexible cable. The system circuit board 163 may be fixed on one surface of a bottom cover 180 through a fixing member, such as a screw.

A third hole H3, in which the first sound generation device 210 is disposed, may be formed in a region of the system circuit board 163 to correspond to the first sound generation device 210. A fourth hole H4, in which the first sound generation device 120 is disposed, may be formed in a region of the bottom cover 180 to correspond to the first sound generation device 210. A size of the third hole H3 may be smaller than a size of the fourth hole H4.

FIGS. 14 and 15 illustrate that one second cable 153 connects the system circuit board 163 and the control circuit board 160, however, the inventive concepts are not limited to a particular number of the second cables 153.

An amplifier 172 and a system-on-chip 173 may be disposed on one surface of the system circuit board 163. Each of the amplifier 172 and the system-on-chip 173 may be formed as an IC.

The amplifier 172 may receive a first sound signal from a sound driving circuit 171, may amplify the first sound signal, and may output the amplified first sound signal to the first sound generation device 210. As a distance between the amplifier 172 and the first sound generation device 210 is decreased, the first sound signal is less likely to be affected by noise. As such, sound quality of first sound output by the first sound generation device 210 may be increased. Accordingly, the distance between the first sound generation device 210 and the amplifier 172 may be less than a distance between the first sound generation device 210 and the system-on-chip 173.

The system-on-chip 173 may receive digital video data from the outside, and may convert the digital video data in accordance with the resolution of a display panel 110. In addition, the system-on-chip 173 may convert the digital video data to improve quality of an image displayed according to the digital video data. The system-on-chip 173 transmits the converted digital video data and timing signals to a timing control circuit 170. For example, the system-on-chip 173 may be a processor of a smart TV, a CPU or a graphic card of a computer or a laptop computer, or an application processor of a smartphone or a tablet PC.

While the first sound generation device 210 is illustrated in FIGS. 14 to 16 as being fixed to the system circuit board 163, on which the system-on-chip is disposed, however, the fixing position of the first sound generation device 210 is not limited to the system circuit board 163. For example, in some exemplary embodiments, the first sound generation device 210 may be fixed to a power circuit board, a sound circuit board, or a dummy circuit board. The power circuit board may be a circuit board, on which a power supply circuit configured to generate voltages necessary for driving the display panel 110 is disposed. The sound circuit board may be a circuit board, on which the sound driving circuit 171 is disposed. In this case, the sound driving circuit 171 may not be disposed on the control circuit board 160. The dummy circuit board refers to a circuit board, on which other components are not disposed, excluding a magnet 211 and the plate 215 of the first sound generation device 210, and the amplifier which amplifies the first sound signal provided to the first sound generation device 210. Each of the power circuit board, the sound circuit board, and the dummy circuit board may be a flexible printed circuit board or a printed circuit board.

According to the illustrated exemplary embodiment shown in FIGS. 14 to 16, the bobbin 212 is fixed to a first substrate 111 or a heat dissipation film 130. The plate 215, to which the magnet 211 is coupled, is fixed to the circuit board. The circuit board is fixed to the bottom cover 180. Since the bottom cover 180 supporting the magnet 211 is rigid as compared with the display panel 110, the bobbin 212, on which a voice coil 213 is wound, may reciprocate from the fixed magnet 211 according to an applied magnetic field. As the bobbin 212 reciprocates, the display panel 110 may be vibrated in a third direction (Z-axis direction), and thus, sound may be output.

Figure 17:
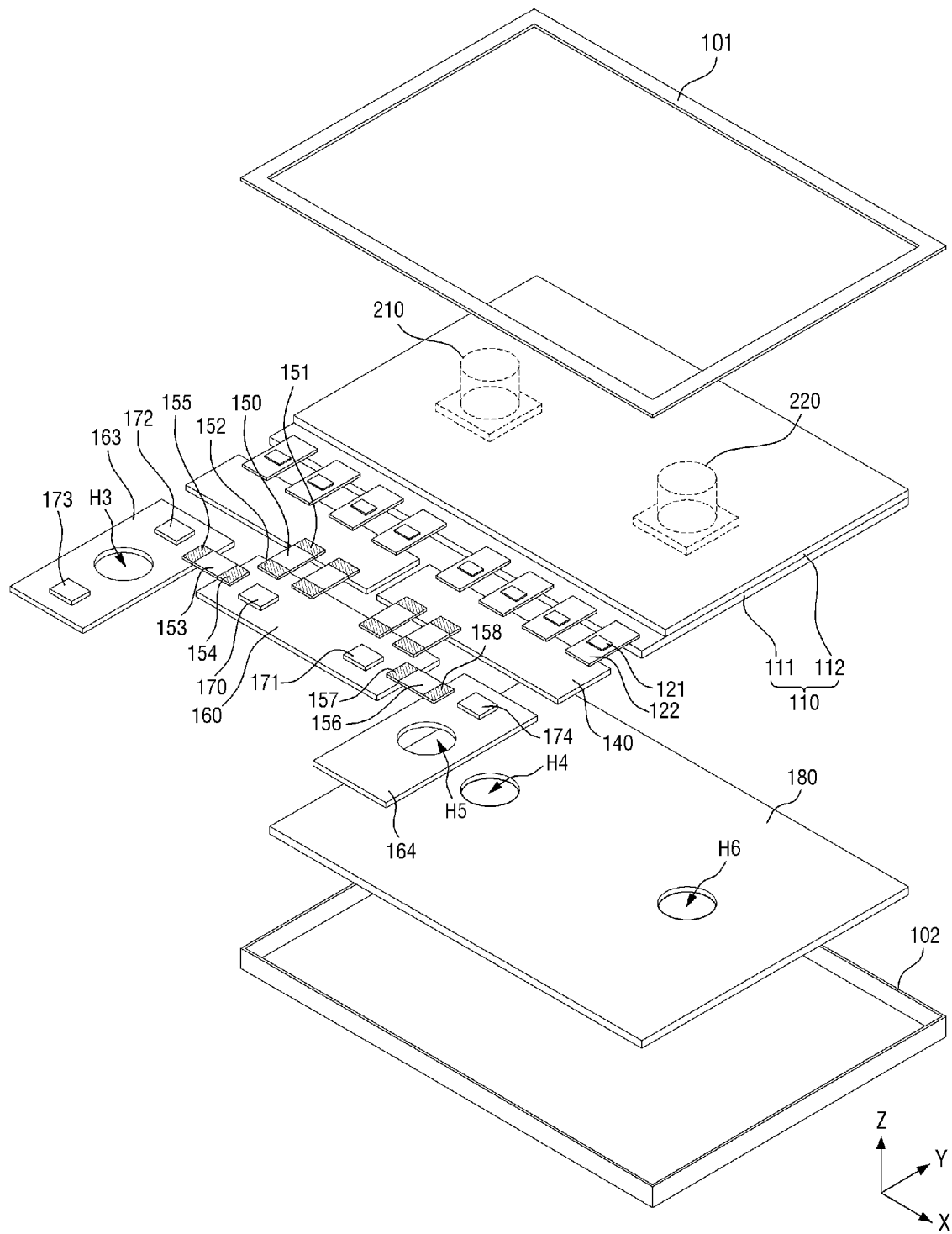
FIG. 17 is an exploded perspective view of a display device according to an exemplary embodiment.
Figure 18:
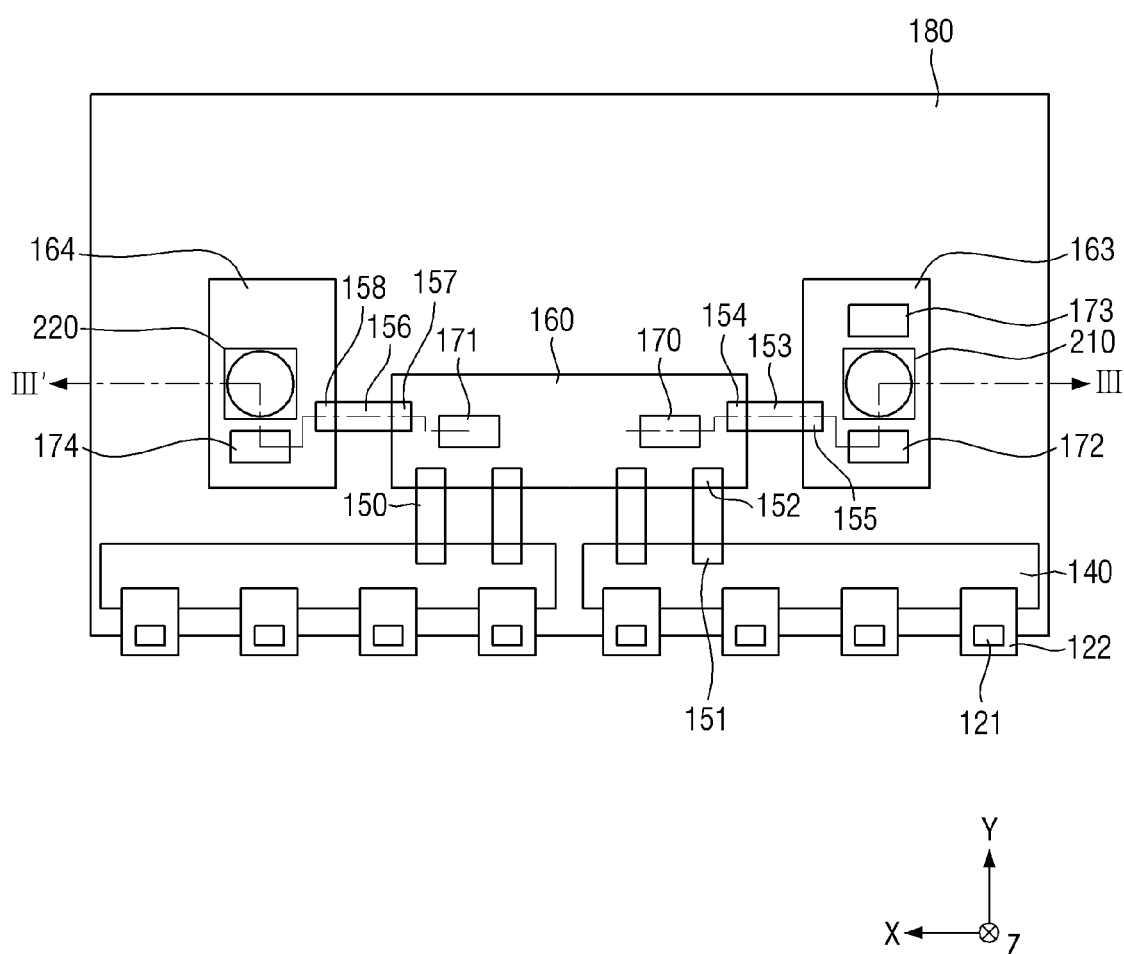
FIG. 18 is a bottom view illustrating a display device according to an exemplary embodiment.
Figure 19:
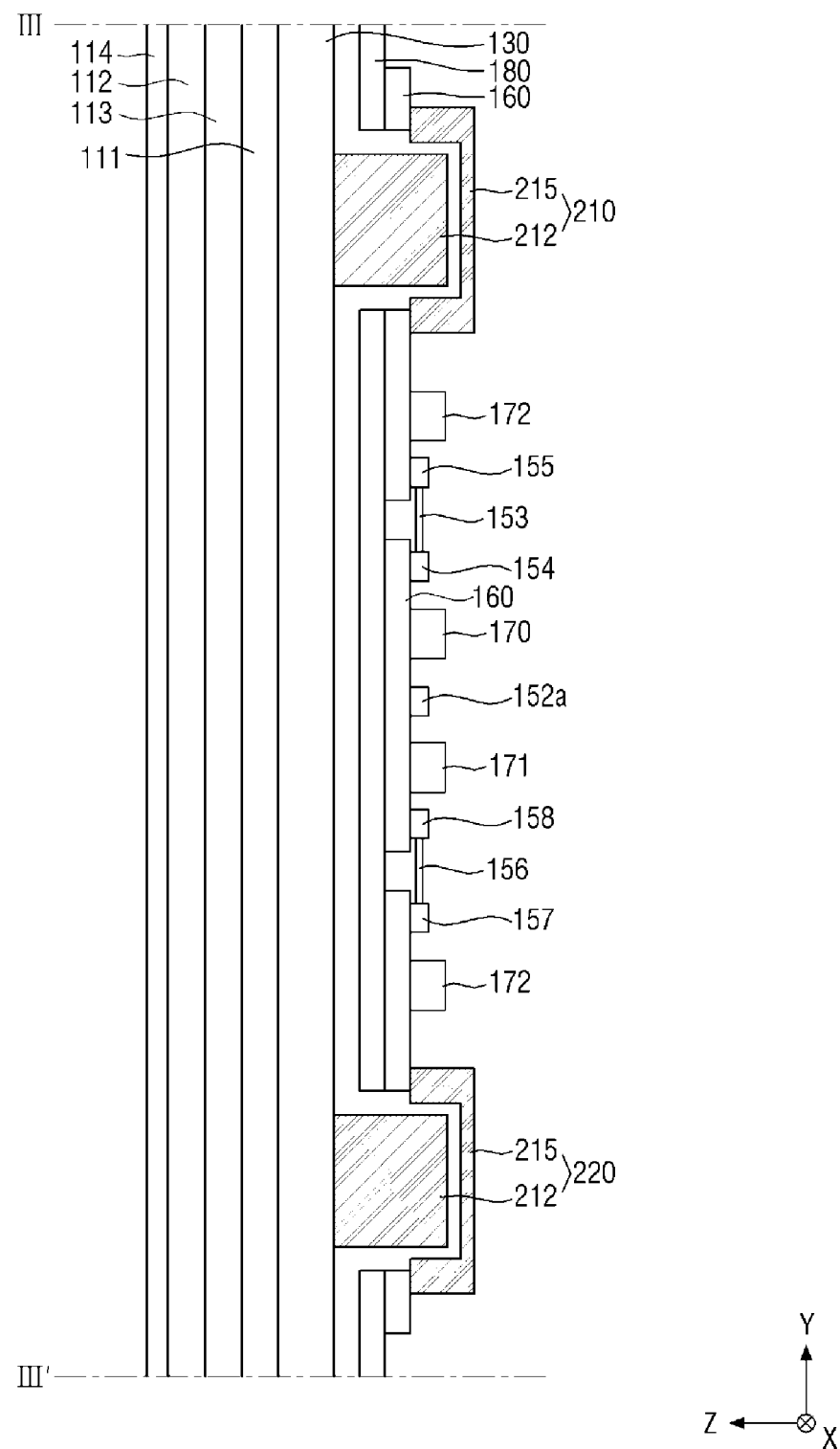
FIG. 19 is a cross-sectional view taken along line of FIG. 16 according to an exemplary embodiment.

FIG. 17 is an exploded perspective view of a display device according to another exemplary embodiment. FIG. 18 is a bottom view of a display device according to an exemplary embodiment. FIG. 19 is a cross-sectional view taken along line of FIG. 16.

The display device according to the illustrated exemplary embodiment shown in FIGS. 17 to 19 is different from that shown in FIGS. 14 to 16, in that a second sound generation device 220 fixed to a dummy circuit board 164 is added. For convenience of description, only a bobbin 212 and a plate 215 of each of a first sound generation device 210 and the second sound generation device 220 are illustrated in FIG. 19.

Referring to FIGS. 17 to 19, the second sound generation device 220 may be disposed on a second surface of a first substrate 111. The second sound generation device 220 may be a vibration device, which vibrates a display panel 110 in a third direction (Z-axis direction) according to a second sound signal of a sound driving circuit 171. In this case, the display panel 110 may function as a diaphragm for outputting sound.

The second sound generation device 220 may be an exciter, which vibrates the display panel 110 by generating a magnetic force using a voice coil. The second sound generation device 220 may be implemented substantially the same as the first sound generation device 210 described above with reference to FIGS. 6 to 9, 10 and 11, or 12 and 13, and thus, repeated descriptions of the second sound generation device 220 will be omitted to avoid redundancy.

The first sound generation device 210 may be disposed near to a left side of the display panel 110, and the second sound generation device 220 may be disposed near to a right side of the display panel 110. When left stereo sound is output as first sound by the first sound generation device 210, and right stereo sound is output as second sound by the second sound generation device 220, the display device 10 may output 2.0-channel stereo sound.

The dummy circuit board 164 may be connected to a control circuit board 160 through a third cable 156. The dummy circuit board 164 may include a fifth connector 157 to be connected to the third cable 156, and the dummy circuit board 164 may include a sixth connector 158 to be connected to the third cable 156. The dummy circuit board 164 may be a flexible printed circuit board or a printed circuit board. The third cable 156 may be a flexible cable. The dummy circuit board 164 may be fixed on one surface of a bottom cover 180 through a fixing member, such as a screw.

A fifth hole H5 in which the second sound generation device 220 is disposed, may be formed in a region of the dummy circuit board 164 to correspond to the second sound generation device 220. A sixth hole H6, in which the second sound generation device 220 is disposed, may be formed in a region of the bottom cover 180 to correspond to the second sound generation device 220. A size of the fifth hole H5 may be smaller than a size of a sixth hole H6.

FIGS. 17 and 18 illustrate that one third cable 156 connects the dummy circuit board 164 and the control circuit board 160, however, the inventive concepts are not limited to a particular number of the third cables 156.

A second amplifier 174 may be disposed on one surface of the dummy circuit board 164. The second amplifier 174 may be formed as an IC.

The second amplifier 174 may receive a second sound signal from the sound driving circuit 171, may amplify the second sound signal, and may output the amplified second sound signal to the second sound generation device 220. As a distance between the second amplifier 174 and the second sound generation device 220 is decreased, the second sound signal is less likely to be affected by noise. As such, sound quality of the second sound output by the second sound generation device 220 may be increased.

The first sound generation device 210 is disposed near to one side of the display panel 110, and the second sound generation device 220 is disposed near to the other side of the display panel 110. Here, the other side of the display panel 110 may be a side opposite to one side of the display panel 110. A system circuit board 163 may be disposed at one side of the control circuit board 160, and the dummy circuit board 164 may be disposed at the other side of the control circuit board 160. Here, the other side of the control circuit board 160 may be a side opposite to one side of the control circuit board 160. For example, the first sound generation device 210 may be disposed near to a left side (or right side) of the display panel 110, and the second sound generation device 220 may be disposed near to a right side (or left side) of the display panel 110. The system circuit board 163 may be disposed at the left side (or right side) of the control circuit board 160, and the dummy circuit board 164 may be disposed at the right side (or left side) of the control circuit board 160. When the left stereo sound is output as the first sound by the first sound generation device 210 and the right stereo sound is output as the second sound by the second sound generation device 220, the display device 10 may output 2.0-channel stereo sound.

Meanwhile, FIGS. 17 to 19 illustrate that the first sound generation device 210 is fixed to the system circuit board 163 on which a system-on-chip 173 is disposed, and the second sound generation device 220 is fixed to the dummy circuit board 164, however, the inventive concepts are not limited thereto. For example, in some exemplary embodiments, the first sound generation device 210 or the second sound generation device 220 may be fixed to a power circuit board or a sound circuit board. The power circuit board may be a circuit board, on which a power supply circuit configured to generate voltages necessary for driving the display panel 110, is disposed. The sound circuit board may be a circuit board, on which the sound driving circuit 171 is disposed. In this case, the sound driving circuit 171 may not be disposed on the control circuit board 160. Each of the power circuit board and the sound circuit board may be a flexible printed circuit board or a printed circuit board.

According to the illustrated exemplary embodiment shown in FIGS. 17 to 19, the first sound generation device 210 and the second sound generation device 220 may be fixed to different circuit boards. The display panel 110 may be vibrated in the third direction (Z-axis direction) by each of the first sound generation device 210 and the second sound generation device 220, and thus, the first sound and the second sound may be output.

Figure 20:
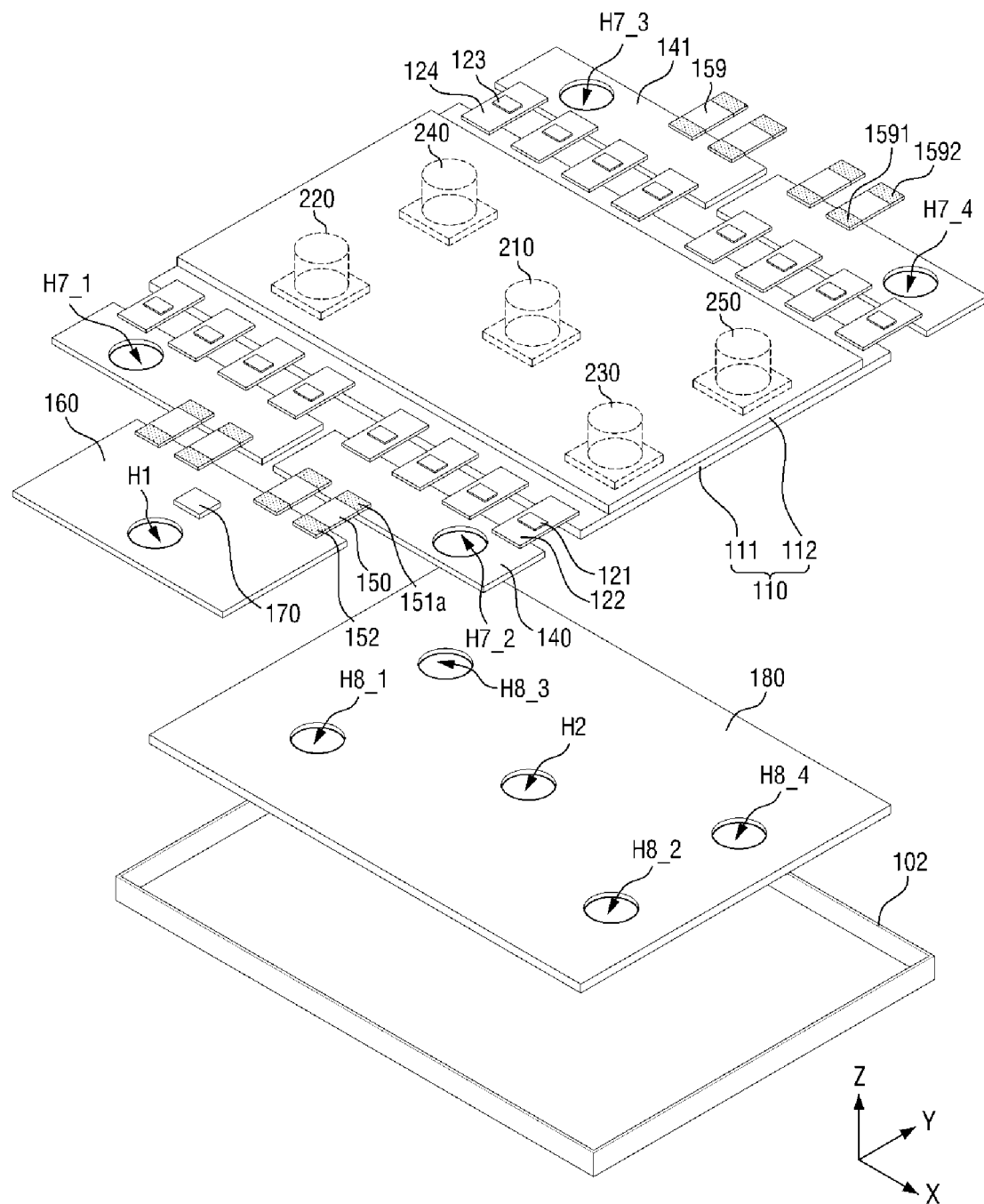
FIG. 20 is an exploded perspective view of a display device according to an exemplary embodiment.
Figure 21:
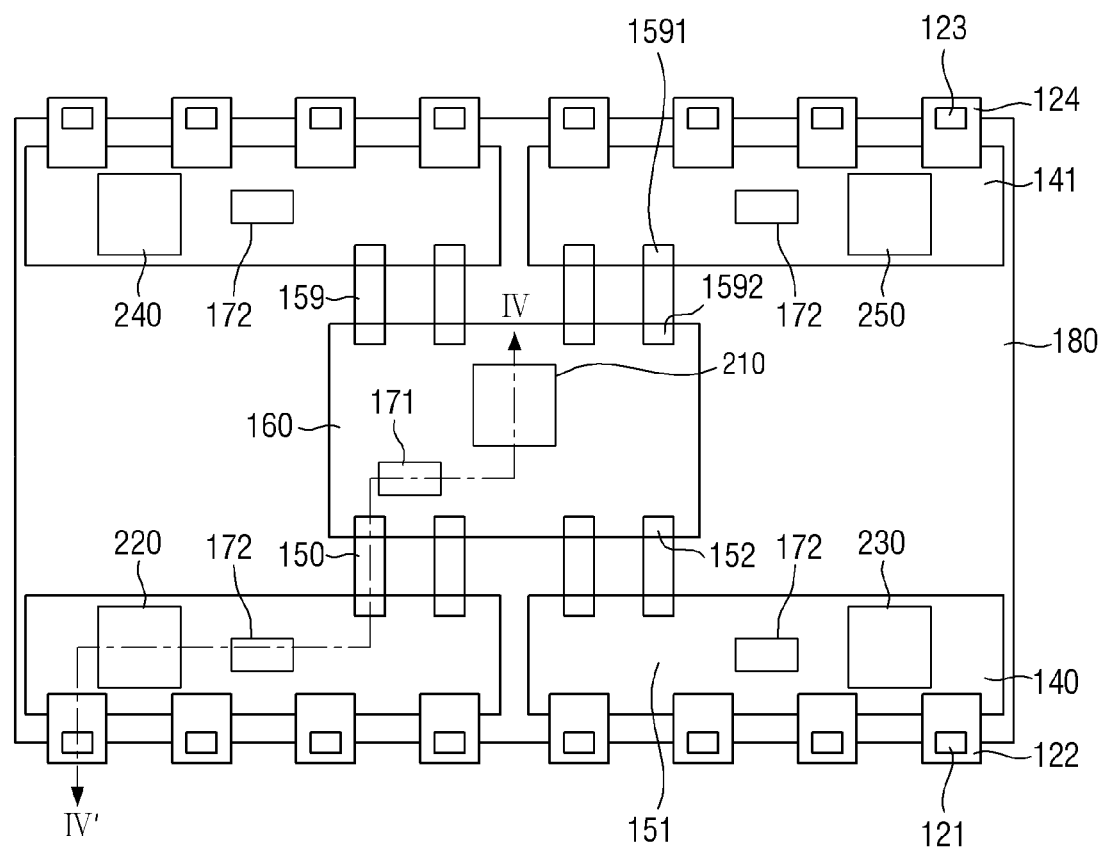
FIG. 21 is a bottom view of a display device according to an exemplary embodiment.
Figure 21:
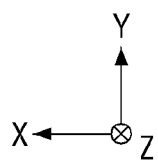
Figure 22:
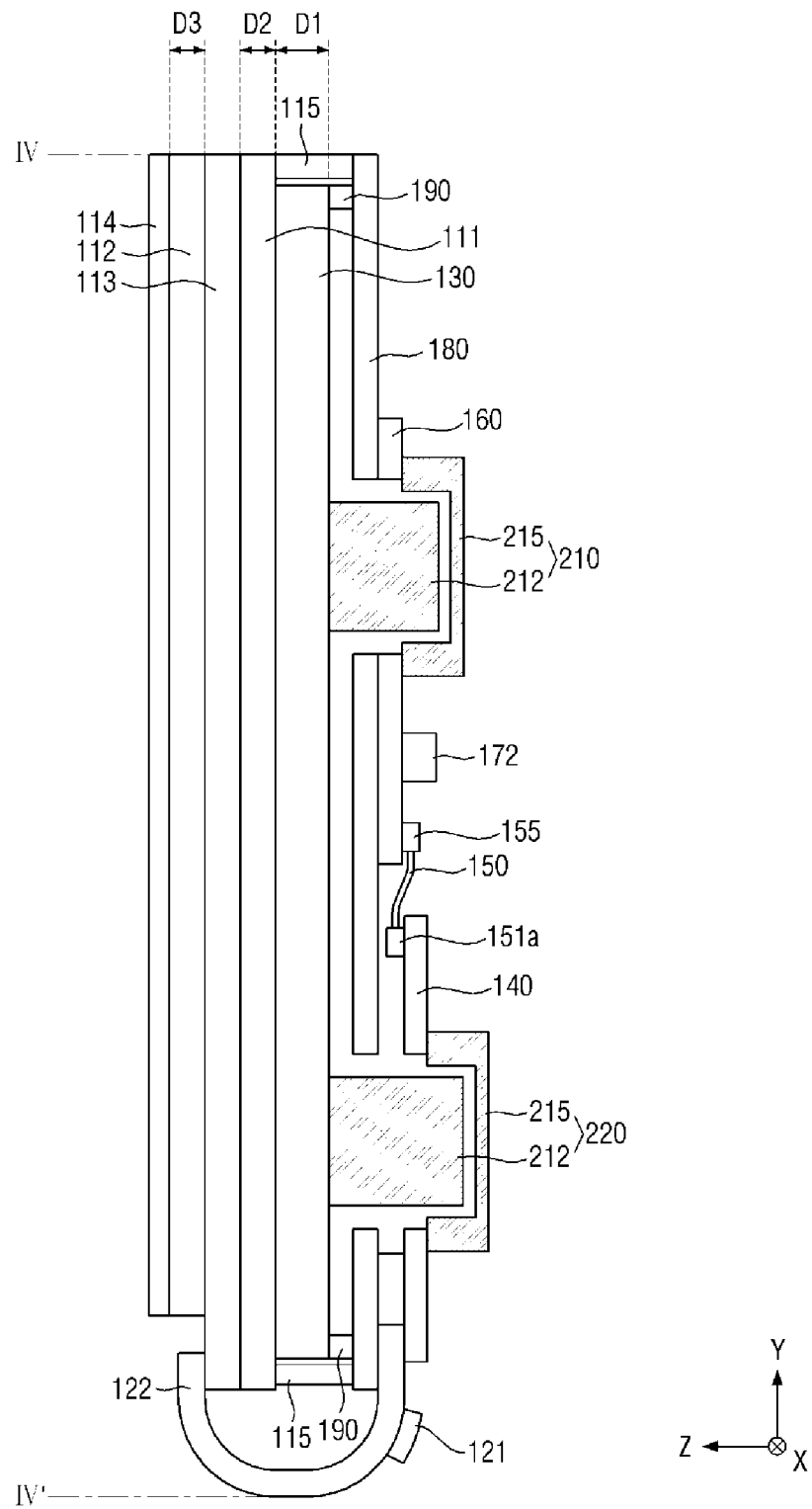
FIG. 22 is a cross-sectional view taken along line IV-IV' of FIG. 21 according to an exemplary embodiment.

FIG. 20 is an exploded perspective view of a display device according to an exemplary embodiment. FIG. 21 is a bottom view of a display device according to an exemplary embodiment. FIG. 22 is a cross-sectional view taken along line IV-IV' of FIG. 21.

The display device shown in FIGS. 20 to 22 is different from that shown in FIGS. 2, 3, and 4, in that a second sound generation device 220 and a third sound generation device 230 fixed to first source circuit boards 140, and a fourth sound generation device 240 and a fifth sound generation device 250 fixed to second source circuit boards 141 are added. For convenience of description, only a bobbin 212 and a plate 215 of each of a first sound generation device 210 and the second sound generation device 220 are illustrated in FIG. 22.

Referring to FIGS. 20 to 22, when a display device 10 has high resolution, such as in quad ultra-high definition (QUHD), the number of data lines of a display panel 110 may be increased. The QUHD refers to a resolution of 7,860×4,320, and has resolution that is four times as high as ultra-high definition (UHD). In this case, in the display device 10, first flexible films 122 may be disposed at one side of the display panel 110, and second flexible films 124 may be disposed at the other side opposite to one side of the display panel 110, and thus, the data lines of the display panel 110 may receive data voltages from first source driving circuits 121 disposed on the first flexible films 122 at one side of the display panel 110, and the second source driving circuits 123 disposed on the second flexible films 124 at the other side of the display device 10.

The first source driving circuits 121 convert digital video data into analog data voltages, in response to a first source control signal of a timing control circuit 170, and supply the analog data voltages to the data lines of the display panel 110 through the first flexible films 122. The second source driving circuits 123 convert digital video data into analog data voltages in response to a second source control signal of the timing control circuit 170, and supply the analog data voltages to the data lines of the display panel 110 through the second flexible films 124.

Each of the first source circuit boards 140 may be connected to a control circuit board 160 through first cables 150. Each of the second source circuit boards 141 may be connected to the control circuit board 160 through fourth cables 159. Each of the first source circuit boards 140 and the second source circuit boards 141 may be a flexible printed circuit board or a printed circuit board. The fourth cables 159 may be flexible cables. The first source circuit boards 140 and the second source circuit boards 141 may be fixed on one surface of a bottom cover 180 through a fixing member, such as a screw.

Each of the first source circuit boards 140 may include first connectors 151 connected to the first cables 150. The control circuit board 160 may include second connectors 152 connected to the first cables 150.

Each of the second source circuit boards 141 may include seventh connectors 1591 connected to the fourth cables 159. The control circuit board 160 may include eighth connectors 1592 connected to the fourth cables 159.

FIG. 21 illustrates that four first cables 150 connect the first source circuit boards 140 and the control circuit board 160, and four fourth cables 159 connect the second source circuit boards 141 and the control circuit board 160, however, the inventive concepts are not limited to a particular number of the first cables 150 and the fourth cables 159.

The timing control circuit 170 may be disposed on the control circuit board 160. The timing control circuit 170 may be formed as an IC. The timing control circuit 170 may receive digital video data and timing signals from a system-on-chip of a system circuit board. The timing control circuit 170 may generate first source control signals for controlling a timing of the first source driving circuits 121 in response to the timing signals. The timing control circuit 170 may generate second source control signals for controlling a timing of the second source driving circuits 123 in response to the timing signals.

The second sound generation device 220 and the third sound generation device 230 may be fixed to the first source circuit boards 140. A $7^{th}\_1$ hole H7_1, in which the second sound generation device 220 is disposed, may be formed in a region of the first source circuit board 140 to correspond to the second sound generation device 220. A $7^{th}\_2$ hole H7_2, in which the third sound generation device 230 is disposed, may be formed in a region of the first source circuit board 140 to correspond to the third sound generation device 230. An $8^{th}\_1$ hole H8_1, in which the second sound generation device 220 is disposed, may be formed in a region of the bottom cover 180 to correspond to the second sound generation device 220. An $8^{th}\_2$ hole H8_2, in which the third sound generation device 230 is disposed, may be formed in a region of the bottom cover 180 to correspond to the third sound generation device 230. A size of the $7^{th}\_1$ hole H7_1 may be smaller than a size of the $8^{th}\_1$ hole H8_1, and a size of the $7^{th}\_2$ hole H7_2 may be smaller than a size of the $8^{th}\_2$ hole H8_2.

A $7^{th}\_3$ hole H7_3, in which the fourth sound generation device 240 is disposed, may be formed in a region of the second source circuit board 141 to correspond to the fourth sound generation device 240. A $7^{th}\_4$ hole H7_4, in which the fifth sound generation device 250 is disposed, may be formed in a region of the second source circuit board 141 to correspond to the fifth sound generation device 250. An $8^{th}\_3$ hole H8_3, in which the fourth sound generation device 240 is disposed, may be formed in a region of the bottom cover 180 to correspond to the fourth sound generation device 240. An $8^{th}\_4$ hole H8_4, in which the fifth sound generation device 250 is disposed, may be formed in a region of the bottom cover 180 to correspond to the fifth sound generation device 250. A size of the 7th_3 hole H7_3 may be smaller than a size of the 8th_3 hole H8_3, and a size of the 7th_4 hole H7_4 may be smaller than a size of the $8^{th}\_4$ hole H8_4.

The first sound generation device 210 may be disposed near to a center of the display panel 110. The second sound generation device 220 may be disposed near to a lower left side of the display panel 110. The third sound generation device 230 may be disposed near to a lower right side of the display panel 110. The fourth sound generation device 240 may be disposed near to an upper left side of the display panel 110. The fifth sound generation device 250 may be disposed near to an upper right side of the display panel 110. Accordingly, the display device 10 may output sound using the sound generation device disposed at a specific position according to an image displayed on the display panel 110 or a position of a user, thereby providing higher quality and realistic sound to the user.

An amplifier 172 may be disposed on each of the first source circuit boards 140 and the second source circuit boards 141. The amplifier 172 may receive a sound signal from a sound driving circuit 171, amplify the sound signal, and output the amplified sound signal to the sound generation device. As a distance between the amplifier 172 and the sound generation device is decreased, a sound signal is less likely to be affected by noise. As such, sound quality of sound output by the sound generation device may be increased.

FIGS. 20 to 22 illustrate that one sound generation device is fixed to each of the first source circuit boards 140 and the second source circuit boards 141, however, the inventive concepts are not limited to a particular number of the sound generation devices fixed to each of the first source circuit boards 140 and the second source circuit boards 141. For example, in some exemplary embodiments, a plurality of sound generation devices may be fixed to each of the first source circuit boards 140 and the second source circuit boards 141.

According to the illustrated exemplary embodiment shown in FIGS. 20 to 22, the first to fifth sound generation devices 210, 220, 230, 240, and 250 may be fixed to different circuit boards. The display panel 110 may be vibrated in a third direction (Z-axis direction) by each of the first to fifth sound generation devices 210, 220, 230, 240, and 250, and thus, sound may be output.

Figure 23:
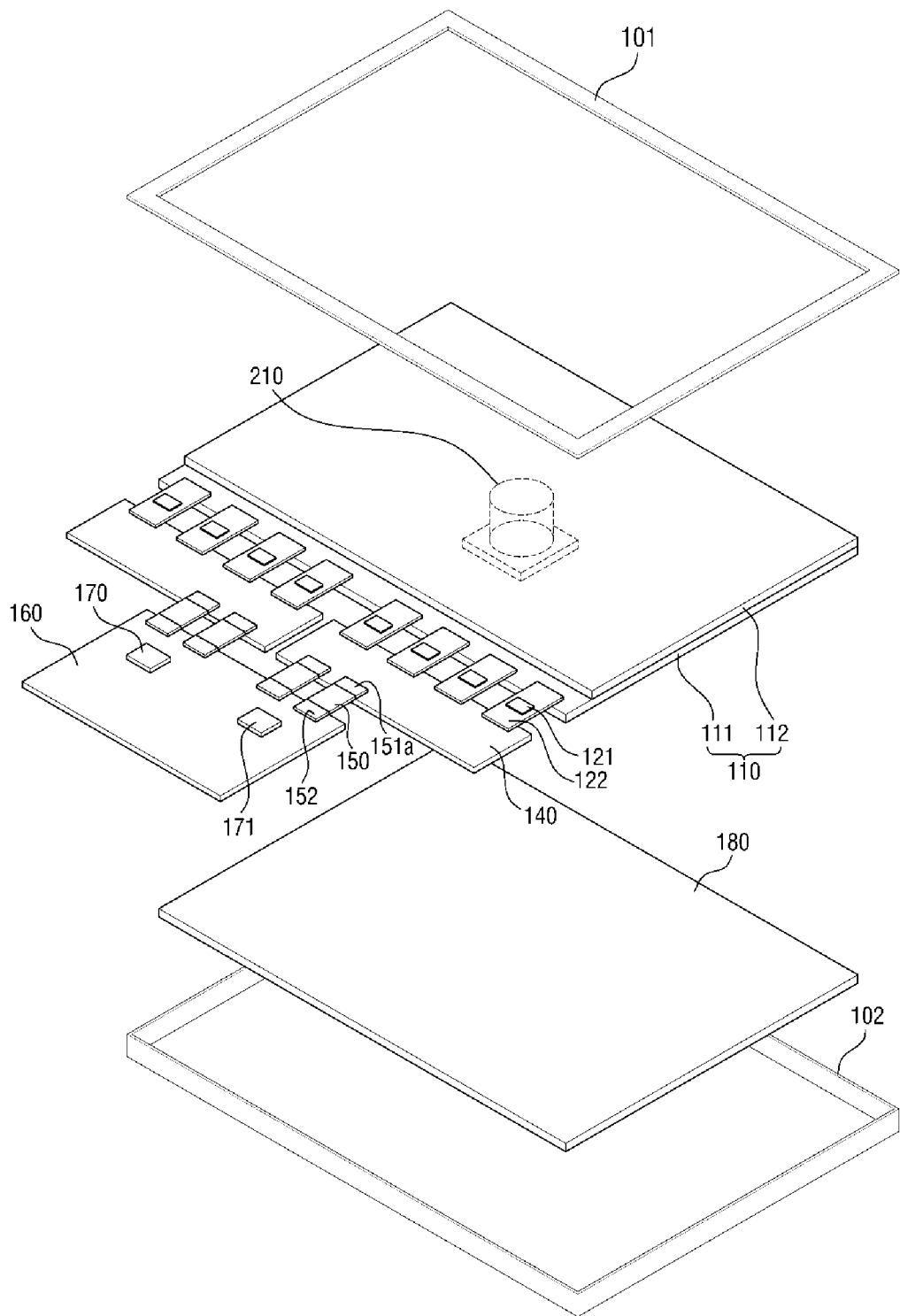
FIG. 23 is an exploded perspective view of a display device according to an exemplary embodiment.
Figure 24:
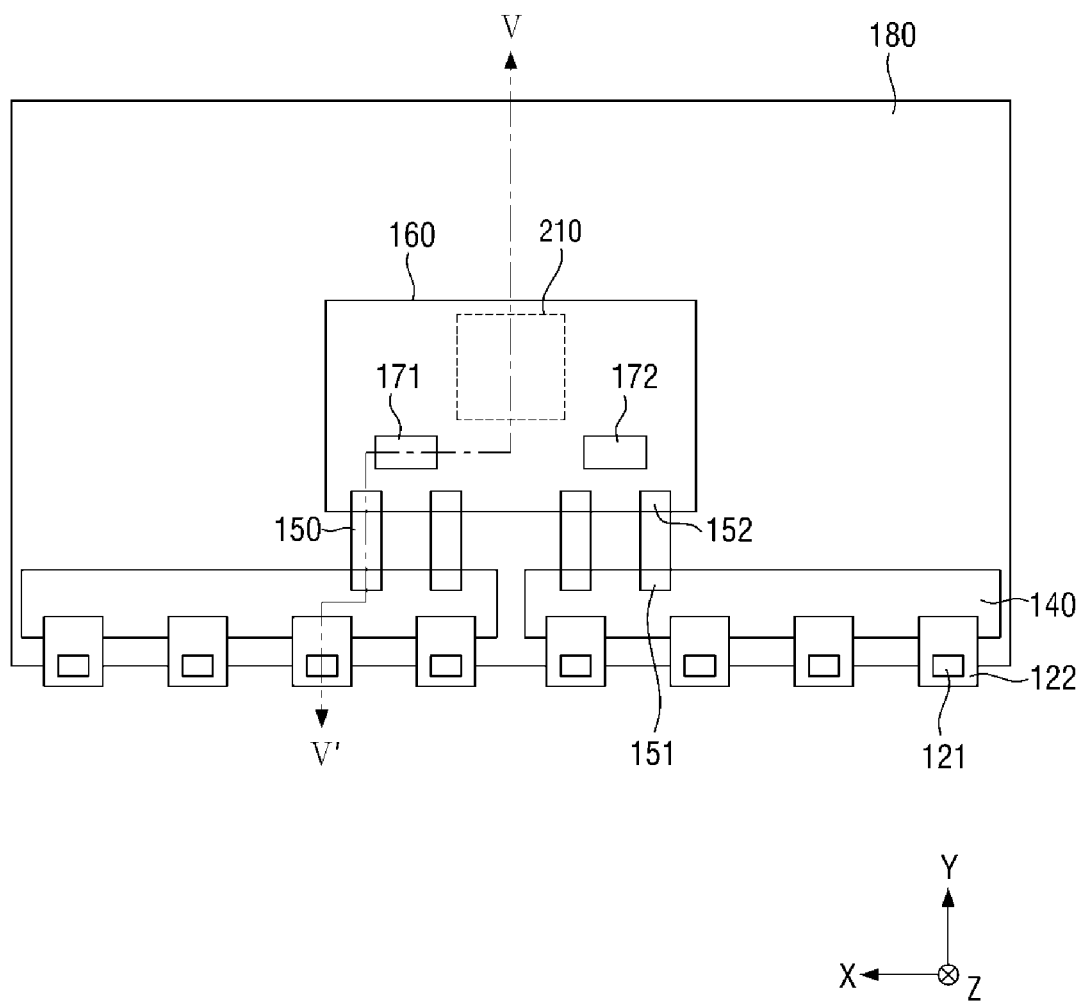
FIG. 24 is a bottom view of a display device according to an exemplary embodiment.
Figure 25:
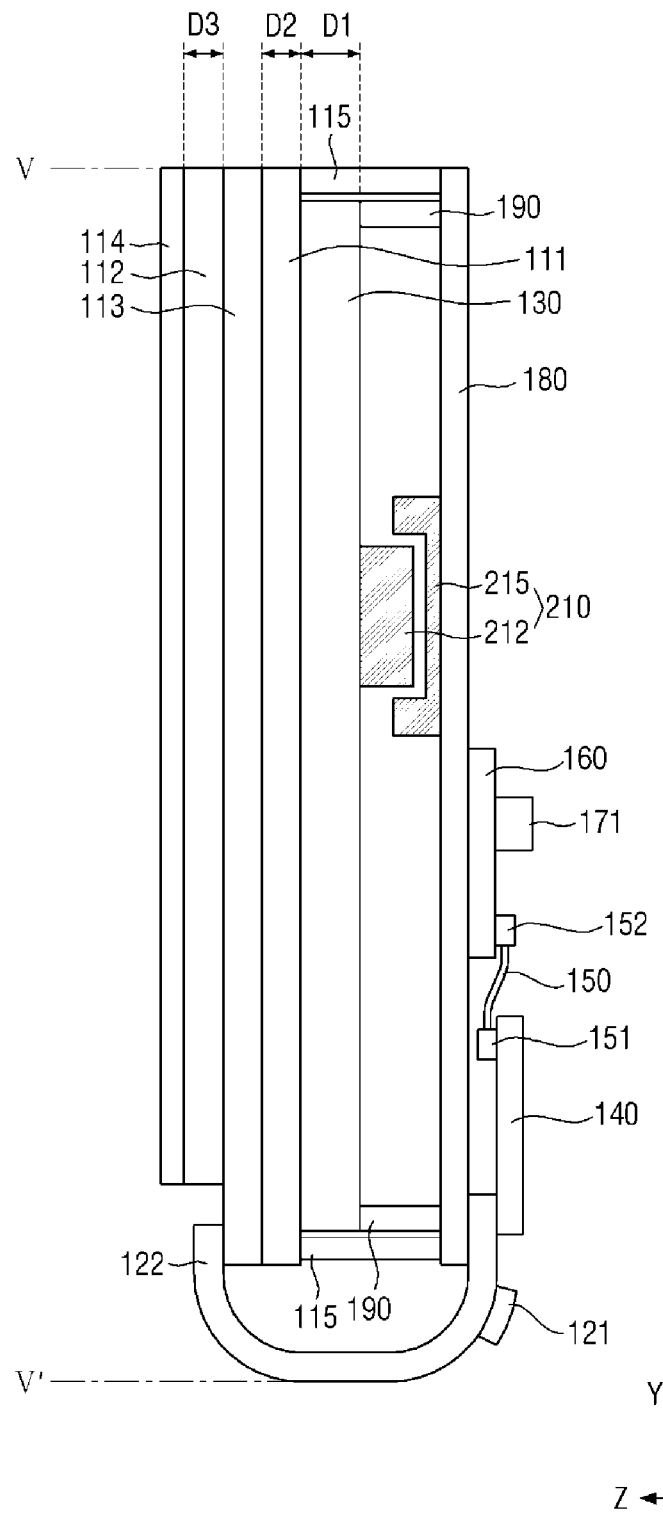
FIG. 25 is a cross-sectional view taken along line V-V' of FIG. 24 according to an exemplary embodiment.

FIG. 23 is an exploded perspective view of a display device according to an exemplary embodiment. FIG. 24 is a bottom view of a display device according to an exemplary embodiment. FIG. 25 is a cross-sectional view taken along line V-V' of FIG. 24.

The display device shown in FIGS. 23 to 25 is different from that shown in FIGS. 2, 3, and 4, in that a first sound generation device 210 is not fixed to a circuit board, such as a control circuit board 160, but is disposed between a first substrate 111 and a bottom cover 180. For convenience of description, only a bobbin 212 and a plate 215 of the first sound generation device 210 are illustrated in FIG. 25.

Referring to FIGS. 23 to 25, the first sound generation device 210 may be disposed between the first substrate 111 or a heat dissipation film 130 and the bottom cover 180. The bobbin 212 of the first sound generation device 210 may be fixed to the heat dissipation film 130 through an adhesive member, and the plate 215 may be fixed to the other surface of the bottom cover 180 facing a second surface of the first substrate 111 through a fixing member, such as a screw. A first hole H1 may not be formed in the control circuit board 160. A second hole H2 of the bottom cover 180 may not be a hole for disposing the first sound generation device 210, but may be a hole, in which a flexible circuit board configured to electrically connect the first sound generation device 210 and the control circuit board 160 is disposed. A size of the second hole H2 may be changed in accordance with a size of the flexible circuit board. The flexible circuit board may be a flexible printed circuit board or a flexible film.

According to the illustrated exemplary embodiment shown in FIGS. 23 to 25, the bobbin 212 is fixed to the first substrate 111 or the heat dissipation film 130. The plate 215, to which a magnet 211 is coupled, is fixed to the bottom cover 180. Since the bottom cover 180 supporting the magnet 211 is rigid as compared with the display panel 110, the bobbin 212 on which a voice coil 213 is wound may reciprocate from the fixed magnet 211 according to an applied magnetic field. As the bobbin 212 reciprocates, the display panel 110 may be vibrated in a third direction (Z-axis direction), and thus, sound may be output.

Figure 26:
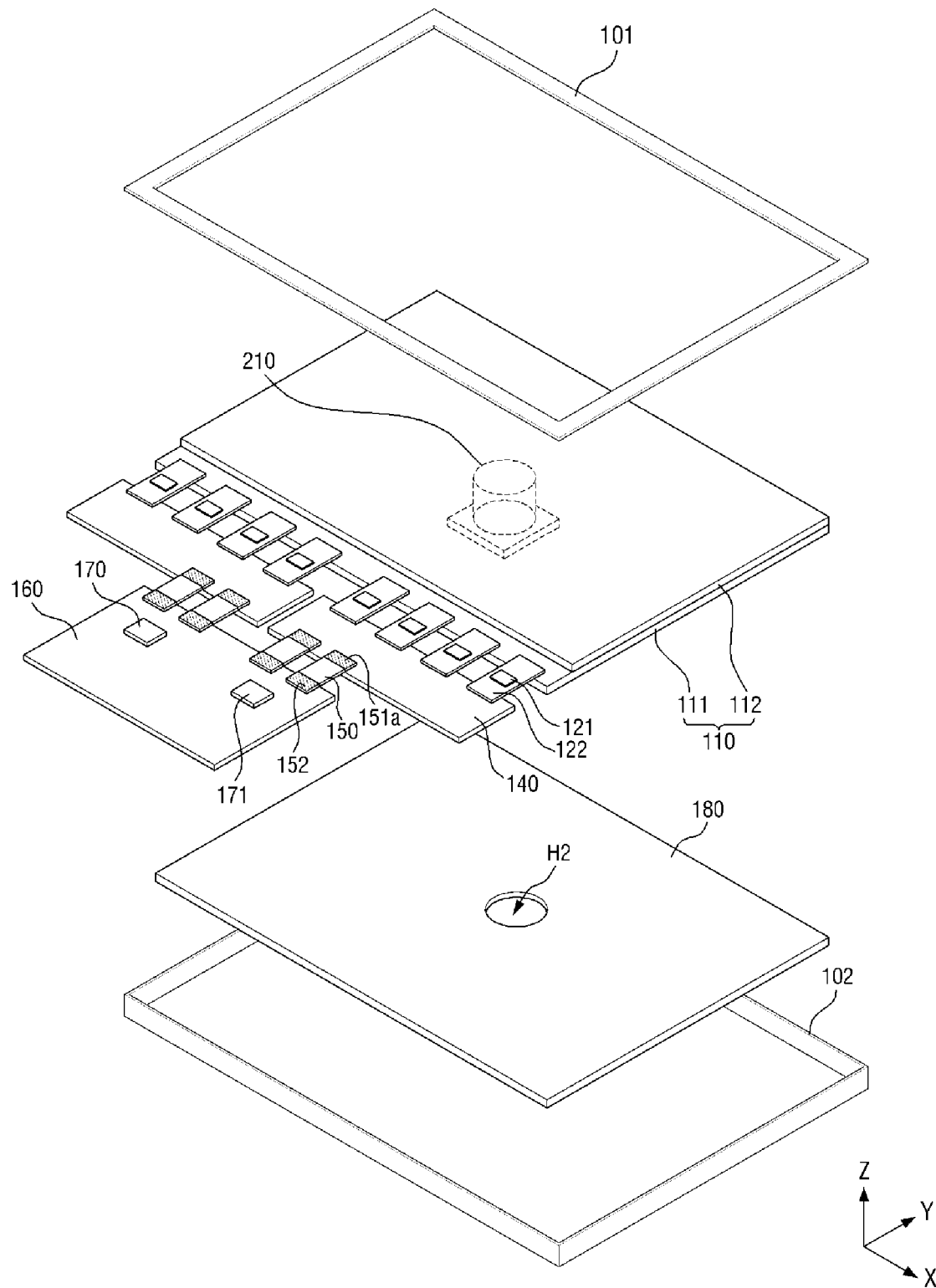
FIG. 26 is an exploded perspective view of a display device according to an exemplary embodiment.
Figure 27:
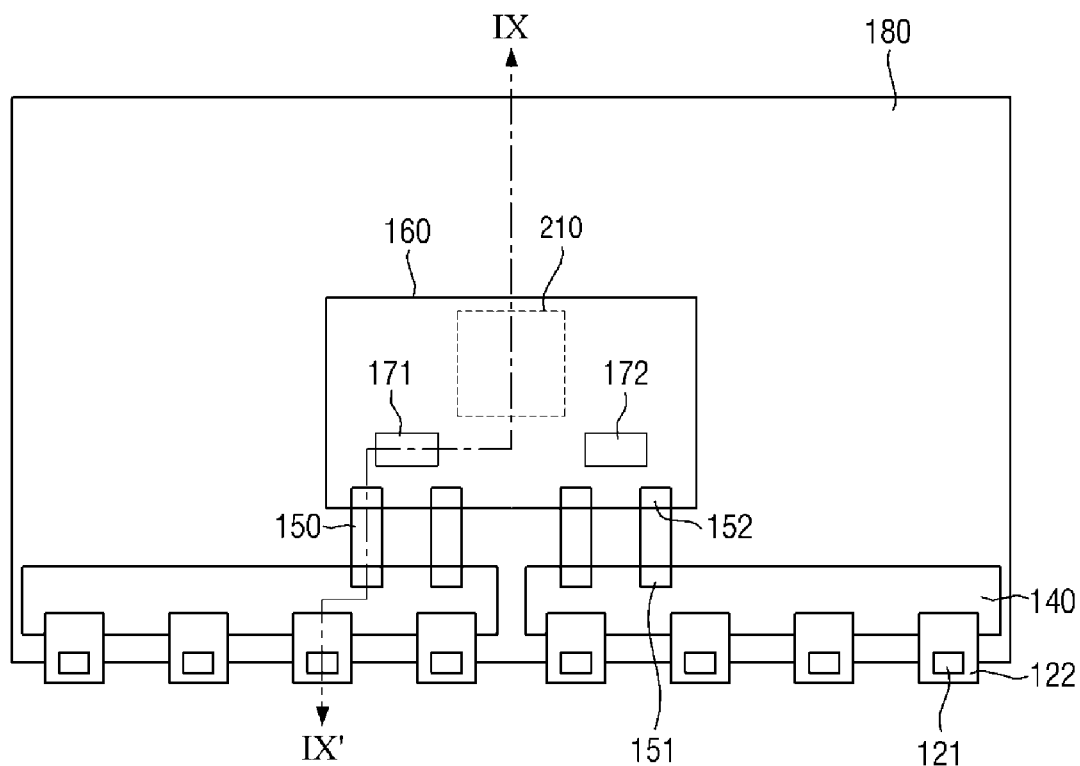
FIG. 27 is a bottom view of a display device according to an exemplary embodiment.
Figure 27:
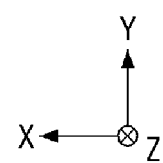
Figure 28:
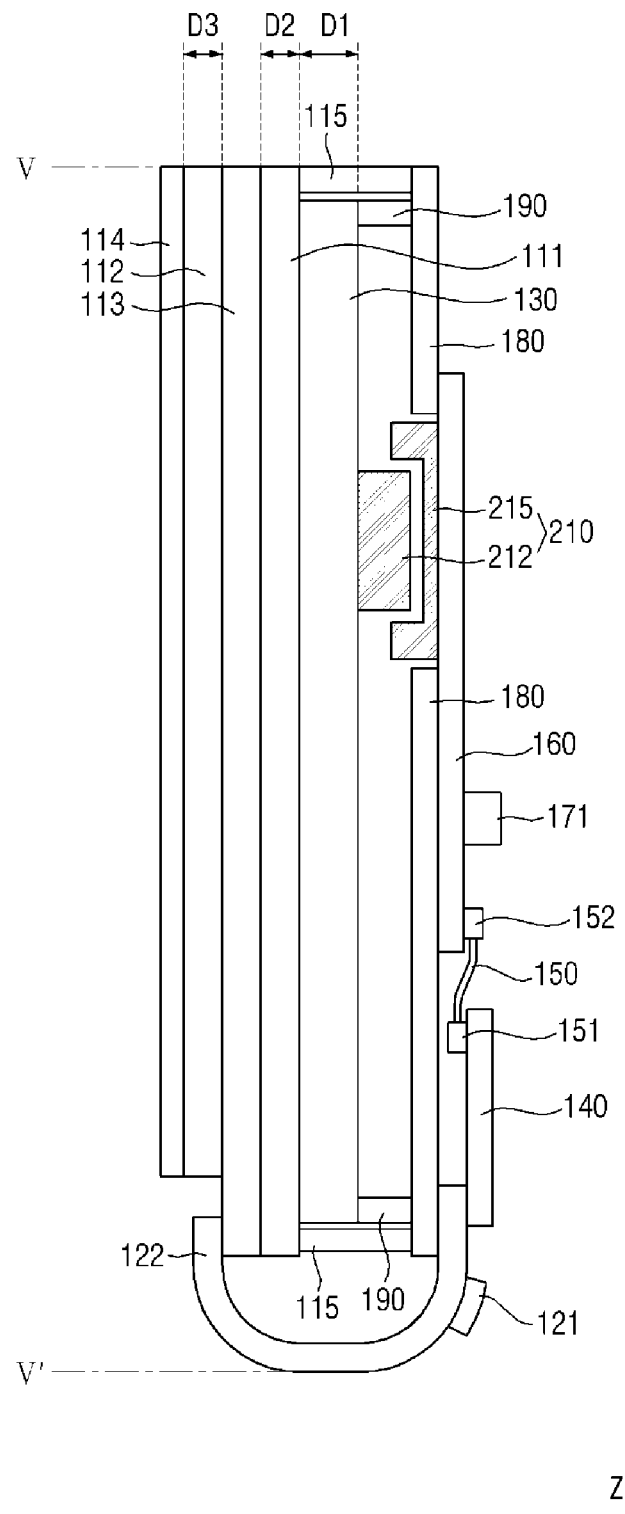
FIG. 28 is a cross-sectional view taken along line IX-IX' of FIG. 24 according to an exemplary embodiment.

FIG. 26 is an exploded perspective view of a display device according to an exemplary embodiment. FIG. 27 is a bottom view of a display device according to an exemplary embodiment. FIG. 28 is a cross-sectional view taken along line IX-IX' of FIG. 24.

The display device shown in FIGS. 26 to 28 is different from that shown in FIGS. 2, 3, and 4, in that a first sound generation device 210 is fixed to a circuit board, such as a control circuit board 160, but the control circuit board 160 does not have a first hole H1. For convenience of description, only a bobbin 212 and a plate 215 of the first sound generation device 210 are illustrated in FIG. 28.

Referring to FIGS. 26 to 28, the first sound generation device 210 may be disposed between a first substrate 111 or a heat dissipation film 130 and the control circuit board 160. The bobbin 212 of the first sound generation device 210 may be fixed to the heat dissipation film 130 through an adhesive member, and the plate 215 may be fixed to the other surface of the control circuit board 160 facing a second surface of the first substrate 111 through a fixing member, such as a screw. The first hole H1 may not be formed in the control circuit board 160. The first sound generation device 210 may be disposed in a second hole H2 of a bottom cover 180.

According to the illustrated exemplary embodiment shown in FIGS. 26 to 28, the bobbin 212 is fixed to the first substrate 111 or the heat dissipation film 130. The plate 215, to which a magnet 211 is coupled, is fixed to the control circuit board 160. Since the bottom cover 180 supporting the magnet 211 is rigid as compared with the display panel 110, the bobbin 212 on which a voice coil 213 is wound may reciprocate from the fixed magnet 211 according to an applied magnetic field. As the bobbin 212 reciprocates, the display panel 110 may be vibrated in a third direction (Z-axis direction), and thus, sound may be output.

According to the exemplary embodiments, since a sound generation device outputs sound using a display panel as a diaphragm, the sound may be output in a direction towards a front surface of the display device, thereby improving sound quality. In addition, due to the sound generation device, it is possible to omit a separate speaker conventionally disposed on a lower surface or one side of the display panel.

In addition, a bobbin of a sound generation device is fixed to a first substrate, a plate to which a magnet is coupled is fixed to a circuit board, and the circuit board is fixed to a bottom cover. Since the bottom cover supporting the magnet is rigid as compared with a display panel, the bobbin on which a voice coil is wound may reciprocate from the fixed magnet according to an applied magnetic field. As the bobbin reciprocates, the display panel may be vibrated in a third direction (Z-axis direction), and thus, sound may be output.

Further, since a sound wiring may be connected directly to a fixing member, a soldering process may be omitted to simply manufacturing process.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display panel including a first substrate and a pixel array layer disposed on a first surface of the first substrate;
a first sound generation device disposed on a second surface of the first substrate opposing the first surface, and configured to vibrate the display panel and output first sound; and
a circuit board disposed on the second surface of the first substrate,
wherein the first sound generation device includes a bobbin disposed on one surface of the first substrate, a voice coil surrounding a side surface of the bobbin, a magnet disposed on the bobbin and spaced apart from the bobbin, and a plate disposed on the magnet and fixed to the circuit board, and
wherein at least a portion of the first sound generation device overlaps the circuit board in a plan view.

2. The display device of claim 1, wherein the circuit board comprises at least one of a printed circuit board and a flexible printed circuit board.

3. The display device of claim 1, further comprising:
flexible films disposed at one side of the display panel;
source driving circuits disposed on the flexible films; and
a timing control circuit disposed on the circuit board and electrically connected to the source driving circuits.

4. The display device of claim 1, further comprising an amplifier disposed on the circuit board and electrically connected to the voice coil of the first sound generation device.

5. The display device of claim 4, further comprising:
flexible films disposed at one side of the display panel;
source driving circuits disposed on the flexible films;
a timing control circuit electrically connected to the source driving circuits; and
a timing circuit board on which the timing control circuit is disposed.

6. The display device of claim 5, further comprising a sound driving circuit disposed on the timing circuit board and electrically connected to the amplifier.

7. The display device of claim 5, further comprising a system-on-chip disposed on the circuit board and electrically connected to the timing control circuit.

8. The display device of claim 5, further comprising a cable configured to connect the timing circuit board and the circuit board.

9. The display device of claim 4, further comprising:
flexible films disposed at one side of the display panel and connected to the circuit board; and
source driving circuits disposed on the flexible films.

10. The display device of claim 9, further comprising:
a timing circuit board, on which a timing control circuit is disposed; and
a cable configured to connect the circuit board and the timing circuit board.

11. A display device comprising:
a display panel including a first substrate and a pixel array layer disposed on a first surface of the first substrate;
a first sound generation device disposed on a second surface of the first substrate opposing the first surface, and configured to vibrate the display panel and output first sound, the first sound generation device including:
a bobbin disposed on one surface of the first substrate;
a voice coil surrounding a side surface of the bobbin;
a magnet disposed on the bobbin and spaced apart from the bobbin;
a plate disposed on the magnet and fixed to the circuit board;
a circuit board disposed on the second surface of the first substrate; and
a sound driving circuit disposed on the circuit board and electrically connected to the voice coil of the first sound generation device.

12. The display device of claim 11, wherein the circuit board includes a first sound wiring and a second sound wiring electrically connected to the sound driving circuit.

13. The display device of claim 12, further comprising:
a first sound connection wiring connected to the first sound wiring;
a second sound connection wiring connected to the second sound wiring; and
a connection unit including a first connection portion connected to one end of the voice coil, a second connection portion connected to the other end of the voice coil, a third connection portion connected to the first sound connection wiring, and a fourth connection portion connected to the second sound connection wiring.

14. The display device of claim 12, wherein the first sound generation device includes:
a first fixing member fixed to a first board hole of the circuit board through a first fixing hole passing through the plate; and
a second fixing member fixed to a second board hole of the circuit board through a second fixing hole passing through the plate.

15. The display device of claim 14, wherein the first sound generation device includes:
a first connection line having one end connected to the first fixing member and the other end connected to one end of the voice coil; and
a second connection line having one end connected to the second fixing member and the other end connected to the other end of the voice coil.

16. The display device of claim 15, wherein the first sound wiring is connected to the first fixing member, and the second sound wiring is connected to the second fixing member.

17. The display device of claim 12, wherein the first sound generation device includes:
a damper disposed between the bobbin and the plate;
a first fixing member fixed to a first fixing hole of the plate through a first damper hole passing through the damper; and
a second fixing member fixed to a second fixing hole of the plate through a second damper hole passing through the damper.

18. The display device of claim 17, wherein the first sound generation device includes:
a first connection line having one end connected to the first fixing member and the other end connected to one end of the voice coil; and
a second connection line having one end connected to the second fixing member and the other end connected to the other end of the voice coil.

19. The display device of claim 18, wherein the first sound wiring is connected to the first fixing member, and the second sound wiring is connected to the second fixing member.

20. A display device comprising:
a display panel including a first substrate and a pixel array layer disposed on a first surface of the first substrate;
a first sound generation device disposed on a second surface of the first substrate opposing the first surface, and configured to vibrate the display panel and output first sound, the first sound generation device including:
a bobbin disposed on one surface of the first substrate;
a voice coil surrounding a side surface of the bobbin;
a magnet disposed on the bobbin and spaced apart from the bobbin;
a plate disposed on the magnet and fixed to the circuit board; and
a circuit board disposed on the second surface of the first substrate;
wherein the circuit board has a first hole, in which the first sound generation device is disposed.

21. The display device of claim 20, wherein a size of the first hole is less than a size of the plate.

22. The display panel of claim 20, further comprising a bottom cover disposed between the circuit board and the first substrate,
wherein the circuit board is fixed to the bottom cover.

23. The display device of claim 22, wherein:
the bottom cover has a second hole, in which the first sound generation device is disposed; and
the size of the first hole is less than a size of the second hole.

* * * * *